(12) United States Patent
Stoops et al.

(10) Patent No.: US 8,970,414 B2
(45) Date of Patent: Mar. 3, 2015

(54) TRI-LEVEL DIGITAL-TO-ANALOG CONVERTER

(71) Applicant: Broadcom Corporation, Irvine, CA (US)

(72) Inventors: David Stoops, Lake Forest, CA (US); Min Gyu Kim, Irvine, CA (US); Vinod Jayakumar, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 56 days.

(21) Appl. No.: 13/931,498

(22) Filed: Jun. 28, 2013

(65) Prior Publication Data

US 2014/0375488 A1 Dec. 25, 2014

Related U.S. Application Data

(60) Provisional application No. 61/838,643, filed on Jun. 24, 2013.

(51) Int. Cl.
*H03M 3/00* (2006.01)
(52) U.S. Cl.
CPC .................................... *H03M 3/502* (2013.01)
USPC .......................................... 341/143; 341/144
(58) Field of Classification Search
CPC ......... H03M 3/456; H03M 3/30; H03M 3/02; H03M 3/50; H03M 1/66
USPC .......................................... 341/143, 144, 146
See application file for complete search history.

(56) References Cited

U.S. PATENT DOCUMENTS

| | | | | |
|---|---|---|---|---|
| 5,257,026 A * | 10/1993 | Thompson et al. | ........... | 341/118 |
| 5,896,304 A * | 4/1999 | Tiemann et al. | ................... | 708/5 |
| 6,535,154 B1 * | 3/2003 | Sculley | ......................... | 341/143 |
| 6,628,218 B2 * | 9/2003 | Brooks et al. | ................. | 341/143 |
| 6,963,297 B2 * | 11/2005 | Robinson et al. | ............. | 341/143 |
| 7,031,395 B2 * | 4/2006 | Hinrichs et al. | .............. | 375/245 |
| 2003/0052805 A1 * | 3/2003 | Troy et al. | ..................... | 341/143 |

(Continued)

OTHER PUBLICATIONS

Fogelman et al., "An Audio ADC Delta-Sigma Modulator with 100-dB Peak SINAD and 102-dB DR Using a Second-Order Mismatch-Shaping DAC", IEEE Journal of Solid-State Circuits, vol. 36, No. 3, Mar. 2001, pp. 339-348.

Nguyen et al., "A 108dB SNR 1.1mW Oversampling Audio DAC with a Three-Level DEM Technique", IEEE Journal of Solid-State Circuits, vol. 43, No. 12, pp. 2592-2600, (Dec. 2008).

(Continued)

*Primary Examiner* — Jean B Jeanglaude
(74) *Attorney, Agent, or Firm* — Fiala & Weaver P.L.L.C.

(57) ABSTRACT

Methods, systems, and apparatuses for converting a digital input signal to an analog output signal are disclosed. A first delta-sigma modulator receives a common mode reference signal and generates a common mode control signal. A data delta-sigma modulator receives a digital input signal and generates a modulated digital input signal. A shuffler receives the modulated digital input signal and the common mode control signal and generates a shuffled digital input signal. A digital to analog converter (DAC) has a plurality of tri-level unit DAC elements each receiving a corresponding portion of the shuffled digital input signal as a first input signal, and receiving second and third input signals. The tri-level unit DAC elements have first outputs coupled together generating a first output signal and second outputs coupled together generating a second output signal. An operational amplifier receives the first and second output signals and generates the analog output signal.

20 Claims, 14 Drawing Sheets

(56) References Cited

U.S. PATENT DOCUMENTS

2004/0252042 A1* 12/2004 Brooks et al. ............... 341/144
2012/0306678 A1* 12/2012 Hezar et al. ................. 341/146

OTHER PUBLICATIONS

Yasuda et al., "A Third-Order D-S Modulator Using Second-Order Noise-Shaping Dynamic Element Matching", IEEE Journal of Solid-State Circuits, vol. 33, No. 12, Dec. 1998, pp. 1879-1886.

* cited by examiner

TRI-LEVEL DIGITAL-TO-ANALOG CONVERTER

CROSS-REFERENCE TO RELATED APPLICATIONS

This application claims the benefit of U.S. Provisional Application No. 61/838,643, filed Jun. 24, 2013, the entirety of which is hereby incorporated by reference herein.

BACKGROUND

1. Technical Field

The subject matter disclosed herein relates to a digital to analog converter. More particularly, the subject matter relates to a tri-level digital to analog converter.

2. Background Art

A digital-to-analog converter ("DAC" or "D-to-A") is a device that converts a digital (usually binary) code to an analog signal (e.g., a current, voltage, or electric charge). A switched resistor DAC is a type of DAC that contains a parallel network of DAC elements containing resistors. Individual resistors in the network are coupled to either a reference voltage or ground based on the digital input to generate an output analog signal. Accordingly, for a given input digital signal, a first portion of the resistors is connected to the reference voltage and a second portion of the resistors is connected to ground, which wastes power in the form of a path from the reference voltage to ground. This may be most significant for a small input signal case, where around half of the resistors are connected to the reference voltage and the other half of the resistors are connected to ground. Furthermore, an amplifier may be present to amplify the analog signal that was output by the network of DAC elements (e.g., as an audio driver). If an output voltage of the amplifier is centered near ground, there can be a common mode current that flows through the dividing resistors and feedback resistors of the amplifier, increasing a flicker noise in those elements.

Oversampling DACs or interpolating DACs, such as a delta-sigma DAC, use a pulse density conversion technique. Delta-sigma DACs require precision DACs to take a low resolution input word and convert it to a precise analog value. This is typically done with unit DAC elements. However, it is very difficult to match individual elements to the required precision of the overall DAC. In order to overcome this, dynamic element matching (DEM) is typically used, in which an input word is converted into a unit element encoded word, where the individual unit element values are shuffled. Ideally, each element is equally used, thereby averaging out their differences over time.

BRIEF SUMMARY

Methods, systems, and apparatuses are described for a tri-level digital to analog converter, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Figure 11C:
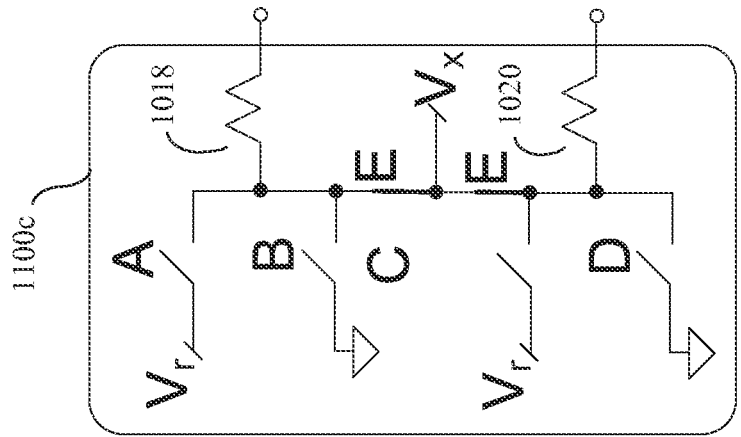
Figure 11B:
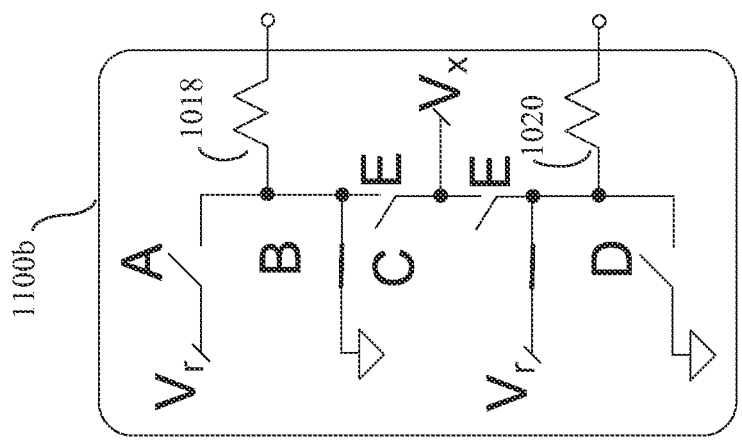
Figure 11A:
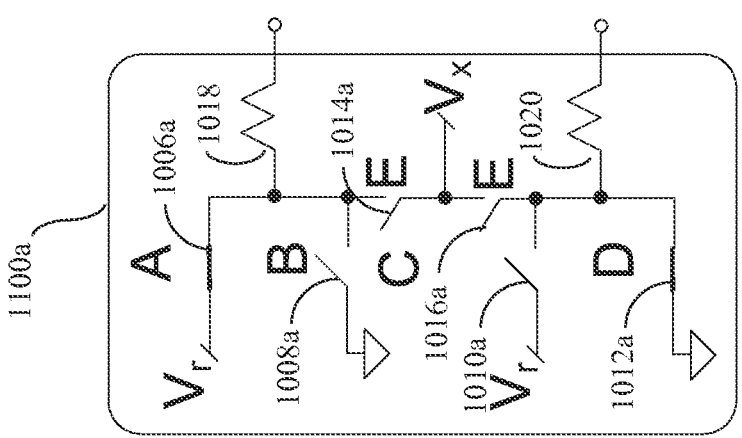

FIG. 11*a*-11*c* depict a block diagram of a tri-level DAC encoding levels −1, 1, and 0, respectively, according to an exemplary embodiment.

Figure 12:
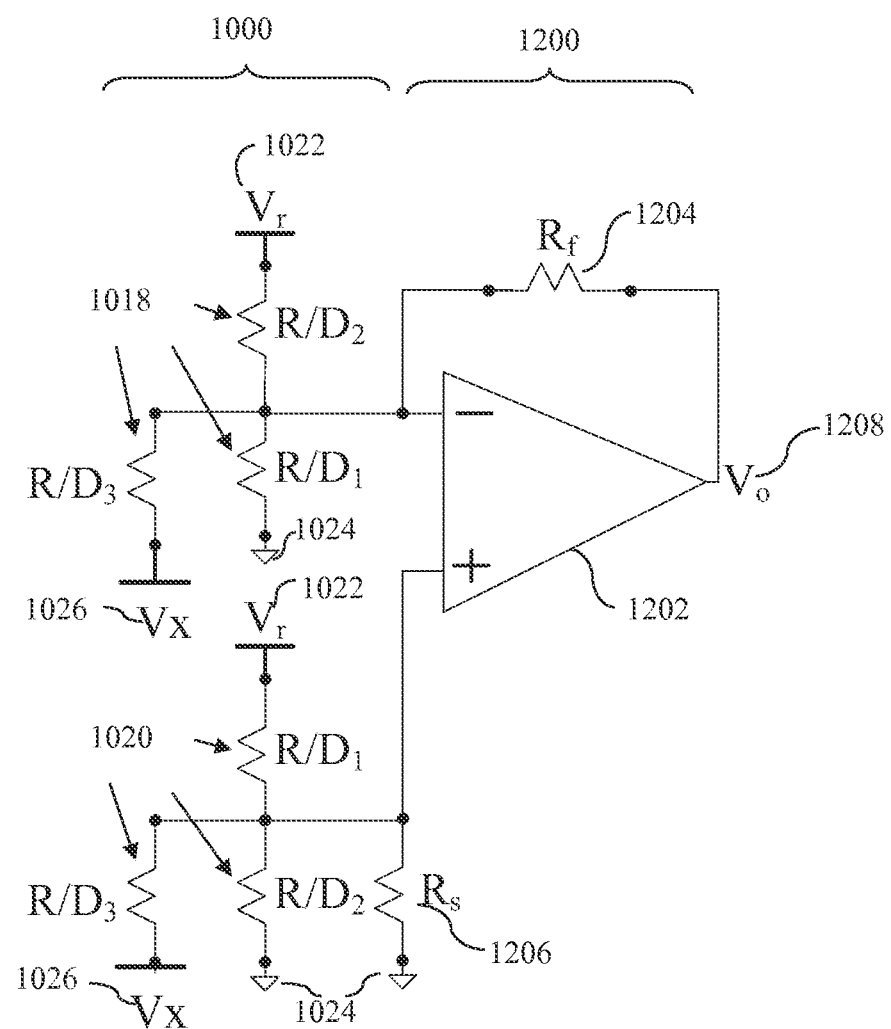

FIG. 12 depicts a block diagram of a tri-level DAC and driver according to an exemplary embodiment.

Figure 13:
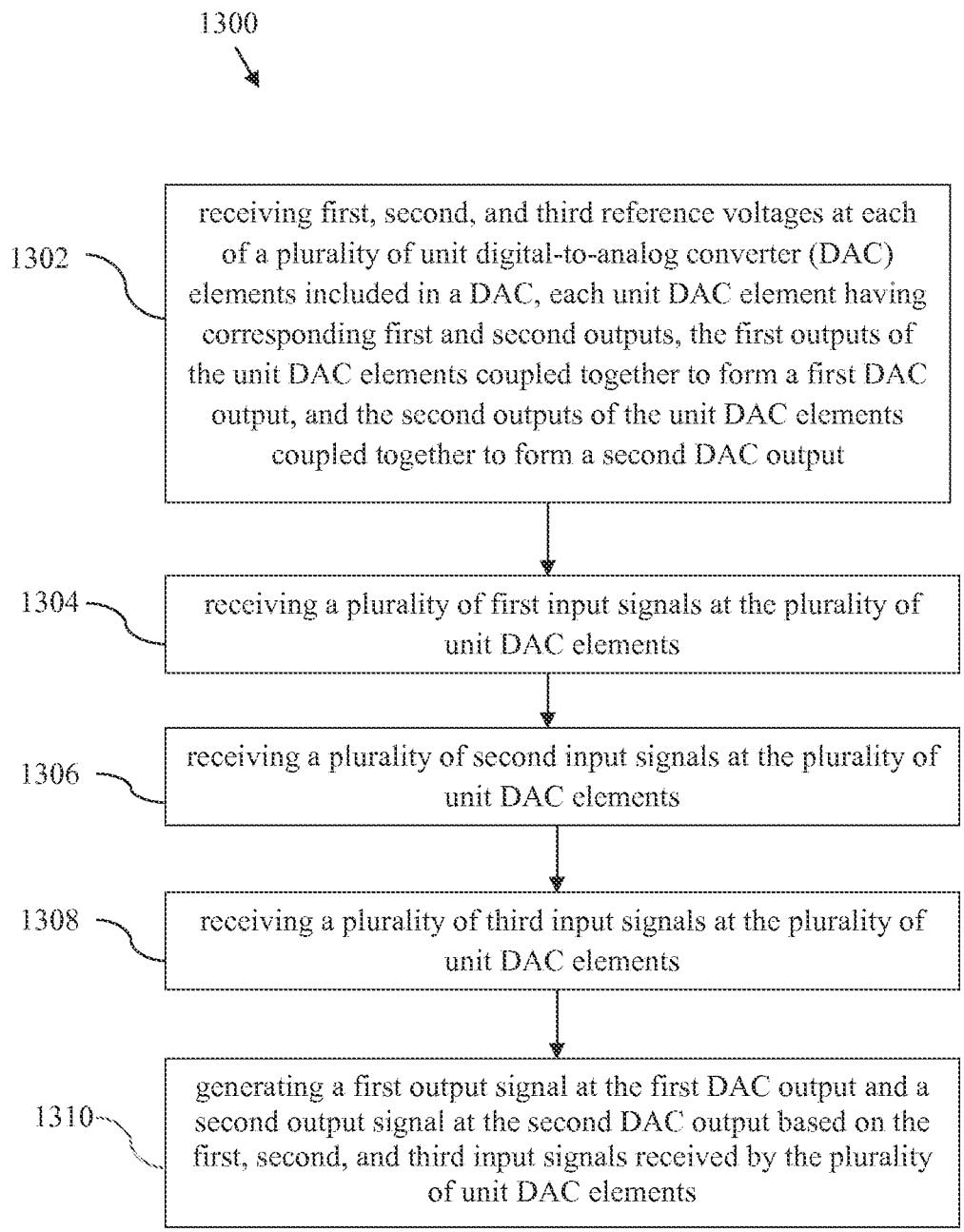

FIG. 13 depicts a flowchart of a method for converting a digital input signal to an analog output signal according to an exemplary embodiment.

Figure 14:
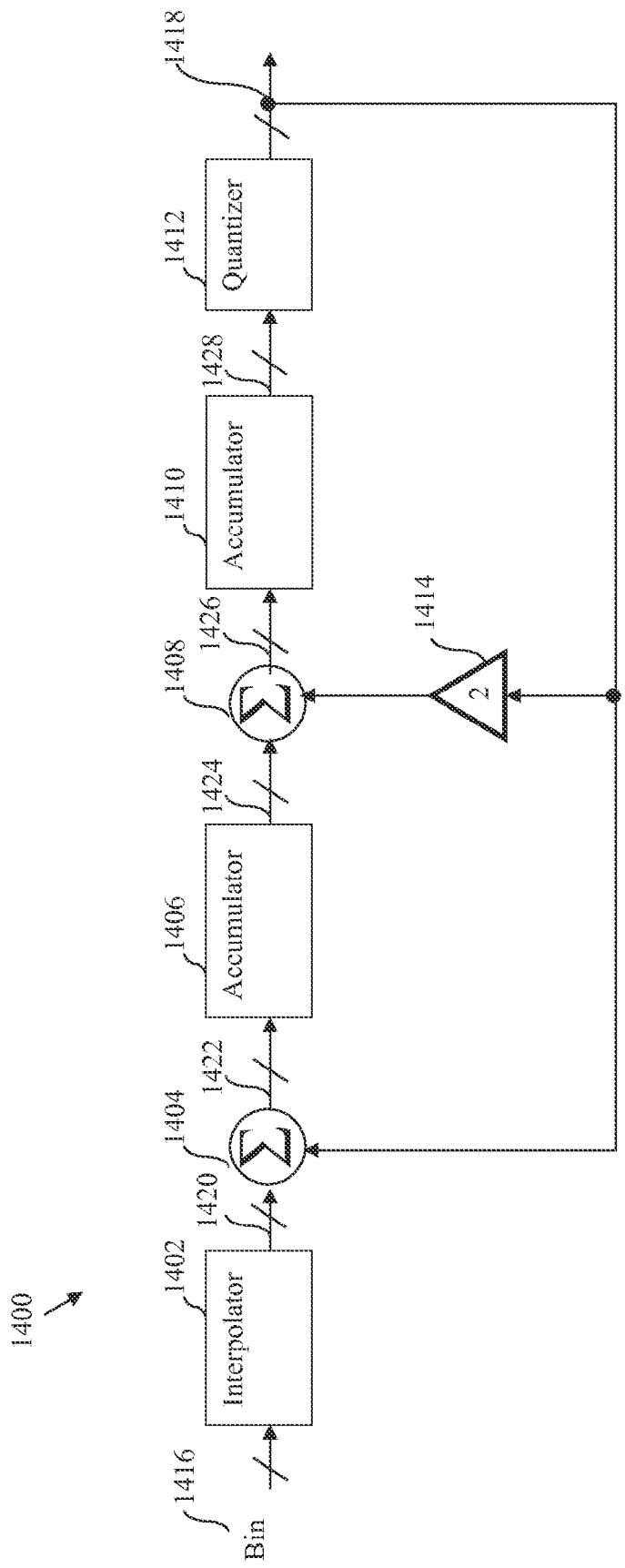

FIG. 14 depicts a block diagram of a data delta-sigma modulator according to an exemplary embodiment.

Figure 15:
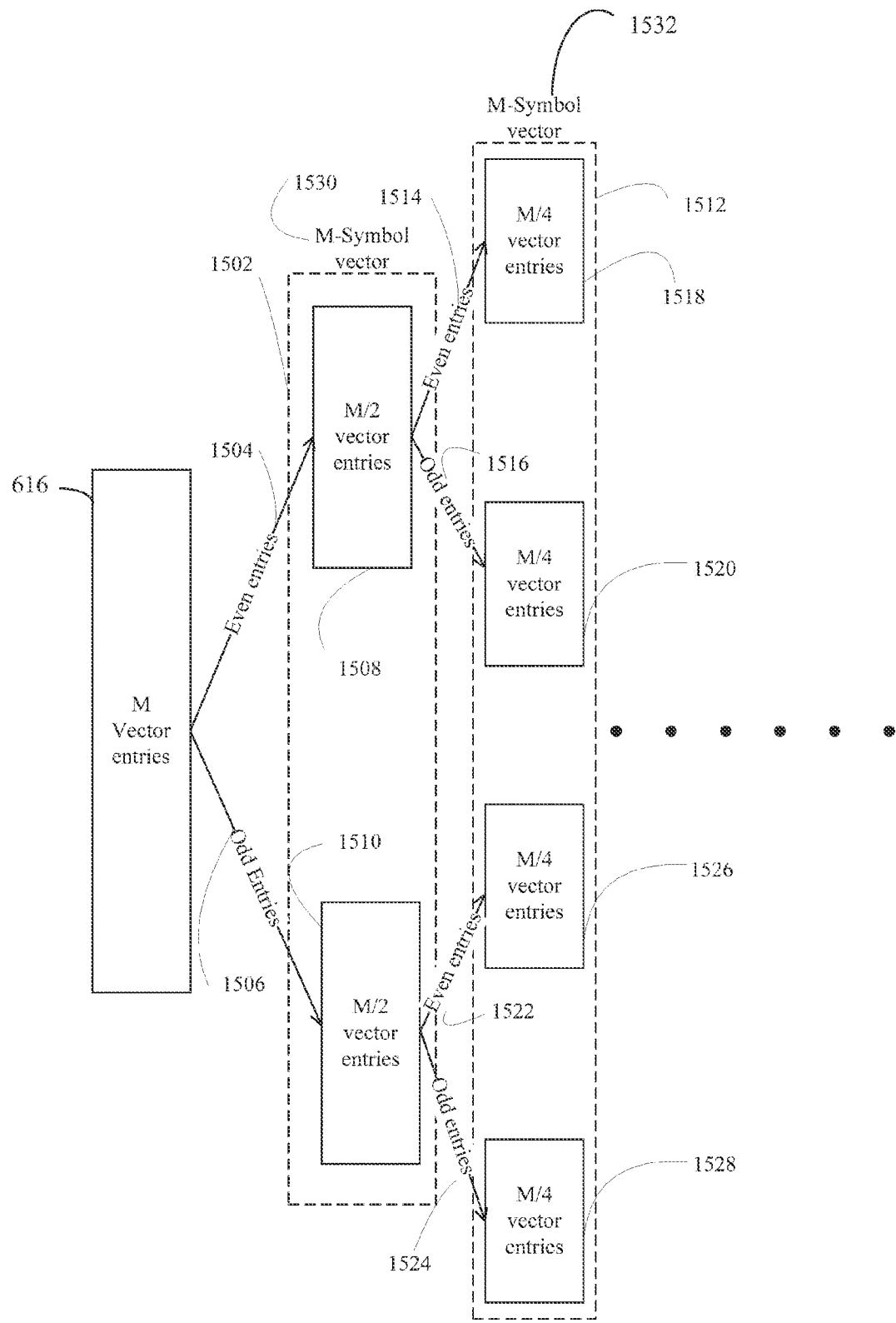

FIG. 15 depicts a block diagram that illustrates a permutation algorithm, according to an exemplary embodiment.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Methods, systems, and apparatuses for converting a digital signal to an analog signal are disclosed. Embodiments enable a digital signal to be converted to an analog signal in a manner that reduces power consumption and/or reduces flicker noise. For instance, a third reference voltage is introduced (in addition to a voltage reference and ground or other reference voltage). DAC elements of a DAC may receive the third reference voltage, such that resistors or other components therein may be coupled to the third reference voltage rather than to the other reference voltages based on an input digital signal. The third reference voltage is selected to have a value to reduce an overall power consumption of the DAC, as well as flicker noise.

For instance, a tri-level digital to analog converter (DAC) is disclosed. The tri-level DAC includes a plurality of unit DAC elements coupled in parallel. Each unit DAC element includes first, second, third, fourth, fifth, and sixth switches. The first and fourth switches are controlled by a first input signal, the second and third switches are controlled by a second input signal, and the fifth and sixth switches are controlled by a third input signal. Each unit DAC element further includes first and second components that each have a first terminal and a second terminal. The first switch is coupled between a first reference voltage and the first terminal of the first component, the second switch is coupled between a second reference voltage and the first terminal of the first component, the third switch is coupled between the first reference voltage and the first terminal of the second component, the fourth switch is coupled between the second reference voltage and the first terminal of the second component, the fifth switch is coupled between a third reference voltage and the first terminal of the first component, and the sixth switch is coupled between the third reference voltage and the first terminal of the second component. The second terminals of the first components of the plurality of unit DAC elements are coupled together to generate a first output signal and the second terminals of the second components of the plurality of unit DAC elements are coupled together to generate a second output signal.

In another embodiment, a system for converting a digital input signal to an analog output signal includes a common mode delta-sigma modulator, a data delta-sigma modulator, a shuffler, and a DAC. The common mode delta-sigma modulator is configured to receive a common mode reference signal and generate a common mode control signal. The data delta-sigma modulator is configured to receive a digital input signal and generate a delta-sigma modulated digital input signal. The shuffler is configured to receive the delta-sigma modulated digital input signal and the common mode control signal, and to generate a shuffled digital input signal. The DAC includes a plurality of tri-level unit DAC elements each configured to receive a corresponding portion of the shuffled digital input signal as a first input signal, to receive a second input signal, and to receive a third input signal. The plurality of tri-level unit DAC elements have first outputs coupled together to generate a first output signal and have second outputs coupled together to generate a second output signal. An operational amplifier is configured to receive the first output signal at an inverting input and the second output signal at a non-inverting input, and to generate the analog output signal.

In still another embodiment, a method for converting a digital input signal to an analog output signal is disclosed. The method includes receiving first, second, and third reference voltages at each of a plurality of unit digital to analog converter (DAC) elements included in a DAC. Each unit DAC element has corresponding first and second outputs. The first outputs of the unit DAC elements are coupled together to form a first DAC output, and the second outputs of the unit DAC elements are coupled together to form a second DAC output. The method further includes receiving a plurality of first input signals at the plurality of unit DAC elements, receiving a plurality of second input signals at the plurality of unit DAC elements, and receiving a plurality of third input signals at the plurality of unit DAC elements. A first output signal is generated at the first DAC output and a second output signal is generated at the second DAC output based on the first, second, and third input signals received by the plurality of unit DAC elements.

Further embodiments are disclosed herein for various aspects of converting a digital signal to an analog signal in a manner that reduces power consumption and/or reduces flicker noise. The following subsections describe various exemplary embodiments. For instance, the next subsection describes example systems and methods for converting a digital signal to an analog signal, followed by subsections describing embodiments for a common mode delta-sigma modulator, a data delta-sigma modulator, a shuffler, and a tri-level DAC.

A. Example Embodiments for Converting Digital Signal to Analog Signal

The example embodiments described herein are provided for illustrative purposes, and are not limiting. The examples described herein may be adapted to any type of tri-level DAC. Further structural and operational embodiments, including modifications/alterations, will become apparent to persons skilled in the relevant art(s) from the teachings herein.

According to embodiments, a tri-level unit element DAC is provided that saves power in a DAC-plus-driver configuration by reducing common mode current. The tri-level unit element DAC receives three inputs signals and outputs two outputs signals. For instance, the tri-level unit element DAC may receive a digital data signal typically received by a DAC element as a first input signal, and may invert the first input signal to generate the second input signal. Furthermore, a third input signal may be received, which as described elsewhere herein, may be a common mode control signal. Based on the three input signals, a tri-level unit element DACs enables three analog output values to be output (e.g., analog voltages corresponding to "0," "−1," or "+1" values), as opposed to two analog output voltages being output (e.g., corresponding to "+1" or "−1" values), as in a standard, two-level DAC. By including a third reference voltage "Vx" (e.g., a reference voltage in the range of the first reference voltage to the second reference voltage, inclusive), in addition to first and second reference voltages (e.g., Vref and −Vref), some resistors are enabled to be coupled to Vx in the tri-level unit element DAC to enable the third analog output voltage. By setting Vx to a mid-level reference voltage, the current flow through the resistors is reduced, thereby reducing power consumption in the circuit. In the case of a switched-R DAC, static current consumption is also reduced by reducing current associated with an output amplifier/driver through the feedback and dividing resistors, thereby reducing flicker (1/f) noise and allowing for smaller chip area and smaller area devices.

Figure 1:
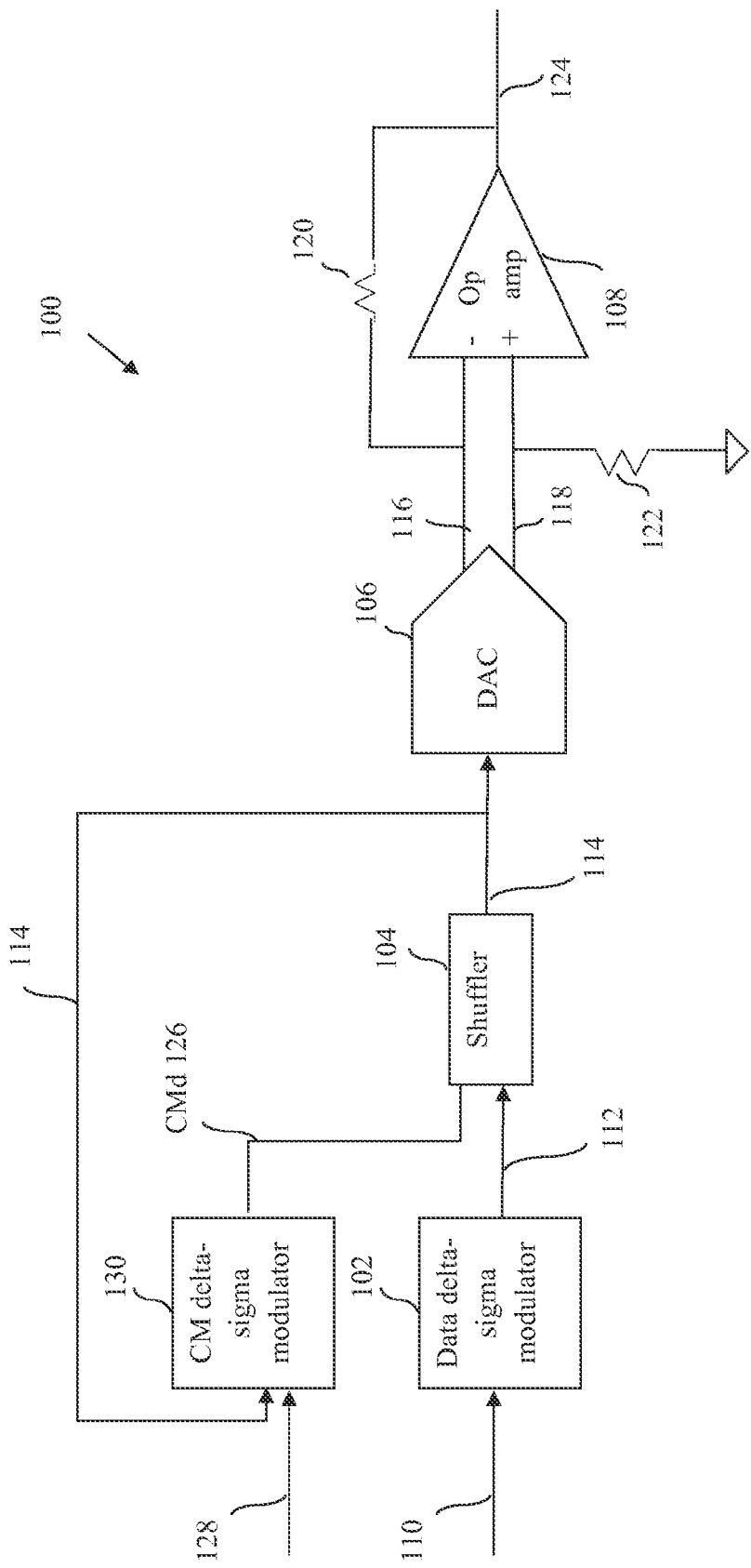
FIG. 1 shows a block diagram of a system for converting a digital input signal to an analog output signal according to an exemplary embodiment.

Such a tri-level DAC element may be used in a variety of circuit implementations, including circuits that process audio and/or video data. For instance, FIG. 1 shows a block diagram of a system 100 for converting a digital input signal to an analog output signal according to an exemplary embodiment. As shown in FIG. 1, system 100 includes a delta-sigma modulator 102, a shuffler 104, a tri-level DAC 106, an operational amplifier (op-amp) 108, and a common mode (CM) delta-sigma modulator 130. In the example of FIG. 1, a feedback resistor 120 and a divider resistor 122 are present for op-amp 108, but are not necessary in all implementations. FIG. 1 is described as follows.

Data delta-sigma modulator 102 receives a digital input signal 110, and is configured to generate a modulated digital input signal 112 based on delta-sigma modulation. Delta-sigma (ΔΣ) modulation is a technique for encoding analog signals into digital signals or higher-resolution digital signals into lower-resolution digital signals. The conversion is performed using feedback, where the difference between the input and output signals is measured and used to improve the conversion. Data delta-sigma modulator 102 is configured to encode a higher-resolution digital input signal into a lower-resolution digital signal that may be mapped to voltages to generate an analog output signal.

Digital input signal 110 may be a digital audio data signal, and in an embodiment, may be a precise, high resolution audio data signal. Digital input signal 110 may be, as an example, a 48 kHz, 24 bit mp3 or voice signal. Modulated digital input signal 112 output by data delta-sigma modulator 102 may be a 17 level, low resolution, 13-26 MHz signal. Data delta-sigma modulator 104 may be configured in various ways, such as according to the embodiments described below in the next subsection.

CM delta-sigma modulator 130 is optionally present. When CM delta-sigma modulator 130 is present, CM delta-sigma modulator 130 receives a common mode reference signal 128. As described in further detail below, common mode reference signal 128 is a reference common mode level, or the desired common mode output level, and is a predetermined value, such as a digital zero value for a desired zero value of common mode. CM delta-sigma modulator 130 also receives a shuffled digital input signal 114, which is fed-back to CM delta-sigma modulator 130. Shuffled digital input signal 114 is indicative of an actual common mode value in system 100, and is further described below. CM delta-sigma modulator 130 is configured to generate a common mode control signal 126 (CMd) based on common mode reference signal 128 and shuffled digital input signal 114. Common mode control signal 126 may be used to control the common mode level in system 100 to be close to the value of common mode reference signal 128. In another embodiment, a common mode value of common mode control signal 126 (CMd) is determined, and a common mode value of digital input signal 112 is determined, and one of signals 112 and 126 having the higher common mode is fed back and input to CM delta-sigma modulator 130 instead of shuffled digital input signal 114.

Shuffler 104 receives modulated digital input signal 112 and common mode control signal 126. Shuffler 104 is configured to shuffle modulated digital input signal 112 to generate a shuffled digital input signal 114. Shuffler 104 may be configured in various ways, such as according to the embodiments described below in a subsequent subsection.

Tri-level DAC 106 receives shuffled digital input signal 114 and generates a first output signal 116 at a first output thereof and a second output signal 118 at a second output thereof, which form a differential output signal (first and second output signals 116 and 118 have generally opposing signal values). Tri-level DAC 106 includes a network of unit element DACs, such as those described above. Tri-level DAC 106 may be configured in various ways, such as according to the embodiments described below in a subsequent subsection.

Op-amp 108 is a differential to single ended op-amp. Op-amp 108 receives first output signal 116 at an inverting input thereof, and receives second output signal 118 at a non-inverting input thereof. Op-amp 108 generates an analog output signal 124, which is an amplified and single-ended version of the differential signal output by tri-level DAC 106 as first and second output signals 116 and 118. Op-amp 108 amplifies the different input signal according to the values of resistors 120 and 122, and the configuration of DAC 106. For instance, in an embodiment, op-amp 108 may operate as a differential amplifier (or difference amplifier) to amplify the input values of first and second output signals 116 and 118 based on the values of resistor 120 and 122, and on resistance values in tri-level DAC 106 at first and second output signals 116 and 118. In an audio implementation (or other implementation that uses a signal driver), op-amp 108 may be an audio driver and may be referred to as a "driver."

Figure 2:
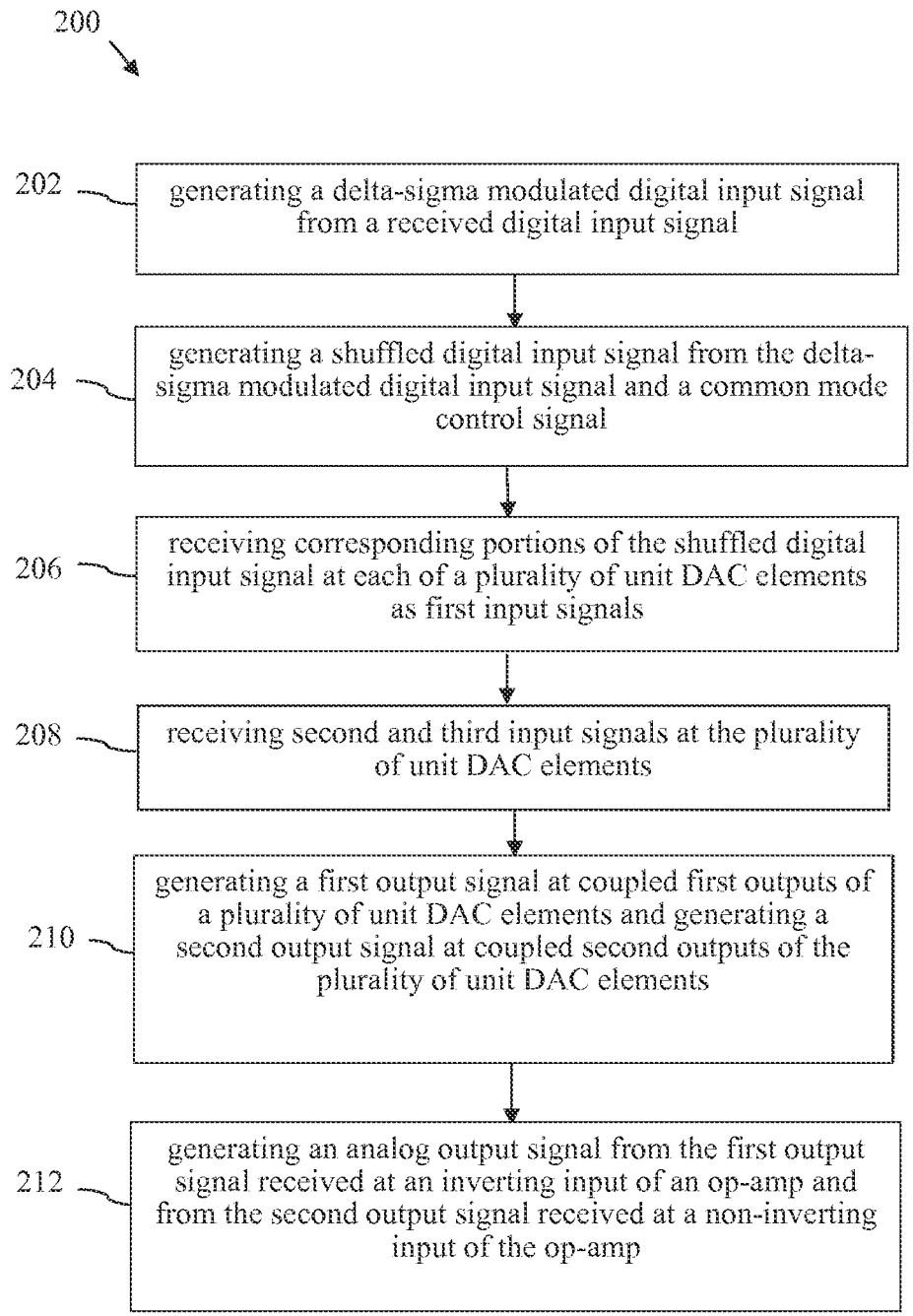
FIG. 2 depicts a flowchart of a method for converting a digital input signal to an analog output signal according to an exemplary embodiment.

System 100 may operate in various ways to perform its functions. For instance, FIG. 2 depicts a flowchart 200 of a method for converting a digital input signal to an analog output signal according to an exemplary embodiment. Flowchart 200 may be performed, for example, by system 100 of FIG. 1. No order of steps is required unless expressly indicated or inherently required. There is no requirement that a method embodiment implement all of the steps illustrated in FIG. 2. Flowchart 200 is simply one of many possible embodiments. Embodiments may implement fewer, more or different steps. Other structural and operational embodiments will be apparent to persons skilled in the relevant art(s) based on the description of flowchart 200. Flowchart 200 is described as follows with respect to system 100 of FIG. 1, for illustrative purposes.

As shown in FIG. 2, flowchart 200 begins with step 202. In step 202, a delta-sigma modulated digital input signal is generated from a received digital input signal. For example, as shown in FIG. 1, data delta-sigma modulator 102 may receive digital input signal 110 of FIG. 1 and generate delta-sigma modulated digital input signal 112 of FIG. 1. Example embodiments for data delta-sigma modulator 102 are described in further detail below.

In step 204, a shuffled digital input signal is generated from the delta-sigma modulated digital input signal a common mode control signal. For instance, as shown in FIG. 1, shuffler 104 receives delta-sigma modulated digital input signal 112 and common mode control signal 126 (CMd). Shuffler 104 is configured to generate shuffled digital input signal 114 based on delta-sigma modulated digital input signal 112 and common mode control signal 126. Example embodiments for shuffler 104 are described in further detail below.

In step 206, corresponding portions of the shuffled digital input signal are received at each of a plurality of unit DAC elements as first input signals. For example, tri-level DAC 106 of FIG. 1 may receive, at each of a plurality of tri-level unit DAC elements thereof (such as described further below), corresponding portions of the shuffled digital input signal 114 as a first input signal.

In step 208, second and third input signals are received at the plurality of unit DAC elements. For example, tri-level DAC 106 of FIG. 1 may receive, at each of a plurality of tri-level unit DAC elements thereof, second and third input signals. For instance, in an embodiment, the second input signal may be an inverted version of the first input signal, and the third input signal may be a common mode control signal, as described in further detail below.

In step 210, generate a first output signal at coupled first outputs of a plurality of unit DAC elements and generate a second output signal at coupled second outputs of the plurality of unit DAC elements. For example, first outputs of a plurality of tri-level unit DAC elements of tri-level DAC 106 of FIG. 1 may be coupled together to produce first output signal 116 and second outputs of a plurality of tri-level unit DAC elements of tri-level DAC 106 of FIG. 1 may be coupled together to produce second output signal 118.

In step 212, an analog output signal is generated from the first output signal received at an inverting input of an op-amp and from the second output signal received at a non-inverting input of the op-amp. For example, analog output signal 124 of FIG. 1 may be generated by op-amp 108 based on first and second output signals 116 and 118 received at the inverting and non-inverting inputs of op-amp 108.

Exemplary embodiments for delta-sigma modulator 102, shuffler 104, and tri-level DAC 106 of FIG. 1 are described in the following subsections.

B. Example Common Mode Delta-Sigma Modulator Embodiments

As described above, according to embodiments, a tri-level DAC includes a plurality of tri-level unit DAC elements. Each tri-level unit DAC element receives a corresponding set of three input signal values (including two data signals and a common mode control signal), is coupled to three reference voltages, and outputs one of three output voltage values. Thus, in using a tri-level DAC, an input has two properties to encode: a differential signal (i.e., D1 and D2) and a common mode (CM). D1 is the number of unit DAC elements having a first output voltage value, and D2 is the number of unit DAC elements having a second output voltage value (out of the first, second, and third possible output voltage values; D3 is the number of unit DAC elements having the third output voltage value), based on the three input signal values. The input code is broken down into D1 and D2 such that:

$$2 \times Din = D1 - D2$$

where

Din is the digital value input;
and the common mode is defined as:

$$CM = D1 + D2,$$

where

D1 and D2 are positive integers within the range of $\{0, M\}$, and

M is a number of unit DAC elements of the DAC (D1+D2+D3).

In order to minimize power consumption, it is desirable to minimize the common mode. This implies that as many resistors of the unit DAC elements are connected to ground as possible. However, the minimum common mode for a given input signal is |2Din|. For example, if the input digital value is −3, then the minimum common mode is 6. This is because as many unit DAC elements as needed to encode the input will be connected, thus affecting the common mode.

Variations in the common mode are not an issue if the overall system has perfect common mode rejection. However, unless feedback resistor 120 of FIG. 1 and divider resistor 122 of FIG. 1 are perfectly matched, the common mode will not be perfectly rejected. If there is a mismatch, part of the output will be dependent on the common mode, D1+D2. If there is no handling of the common mode, then D1+D2=|2Din|, implying that there will be an even order distortion at the output. In order to combat this, a common mode control signal using delta-sigma modulation may be implemented, in an embodiment. To minimize or eliminate distortion caused by the common mode, it is desirable to keep the common mode at a constant level. Unfortunately, the only common mode level that can be constant across all inputs is D1+D2=M, implying a two-level unit DAC element. However, a tradeoff can be achieved between setting a lower common mode, which saves power, and distortion at the output. Unfortunately, as soon as the input signal amplitude exceeds the set common mode, there is a precipitous drop off in signal to noise distortion ratio (SNDR).

It is advantageous to use delta-sigma modulation to control the common mode for at least several reasons. First, if the input exceeds a desired common mode (CM) level, at least for very short periods of time, a CM delta-sigma loop may be used to compensate for this, thereby creating a much more gradual drop off in SNDR as the input exceeds the desired common mode level. Second, since one cannot turn on a fraction of a DAC element, any implemented common mode control must set an integer common mode. However, by delta-sigma modulating the common mode, fractional common mode levels may be achieved. Third, with a delta-sigma modulated CM, it can be determined if control over the common mode is being lost. In particular, it is possible to check the accumulator levels of a CM delta-sigma modulator, and see if they exceed particular predetermined threshold(s). If they do, it may be assumed that the input code is controlling the common mode.

Figure 3:
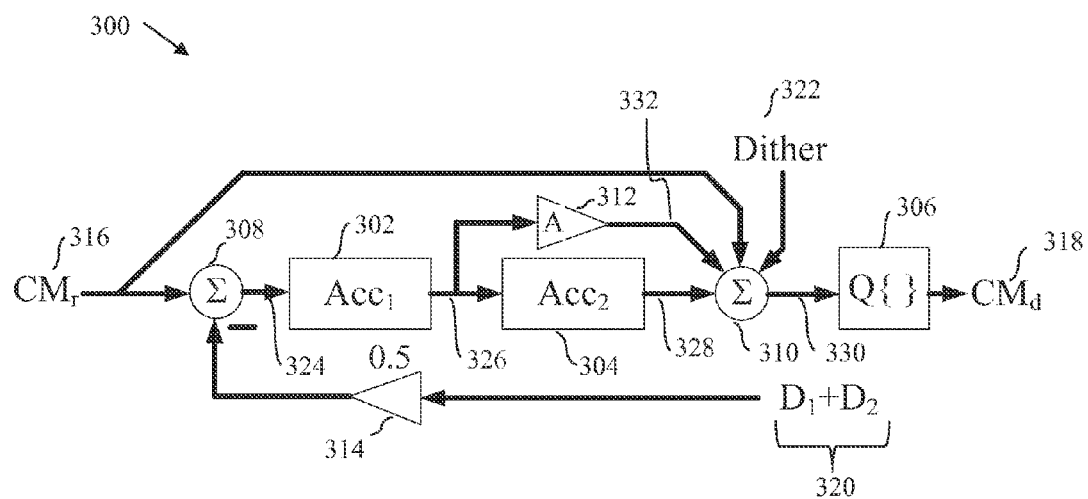
FIG. 3 depicts a block diagram of a common mode delta-sigma modulator according to an exemplary embodiment.

FIG. 3 shows a block diagram of a CM delta-sigma modulator 300, according to an example embodiment. CM delta-sigma modulator 300 can be used to set a static common mode level. As shown in FIG. 3, delta-sigma modulator 300 includes a first accumulator 302, a second accumulator 304, a quantizer 306, a first adder 308, a second adder 310, a first gain block 312, and a second gain block 314. Second gain block 314 is optional depending on a range of common mode reference signal 316 (CMr) versus a range of feedback signal D1+D2 (actual common mode signal 320). CM delta-sigma modulator 300 is described as follows.

Common mode reference signal 316 (CMr) is received by first adder 308 and second adder 310. Common mode reference signal 316 is the reference common mode level, or the desired common mode output level, and is preset to a value, such as a digital zero value. First adder 308 also receives an actual common mode signal 320, which is the value of D1+D2, divided by 2 by second gain block 314 (multiplied by 0.5). D1+D2 is the true common mode level that is encoded and is fed back. Thus, adder 308 subtracts half of the actual common mode signal 320 from common mode reference signal 316 to generate an error 324. Error 324 is essentially the difference between common mode reference signal 316, which is the desired common mode signal, and common mode control signal 318 (CMd) output by CM delta-sigma modulator 300. D1+D2 is equal to either common mode control signal 318 (CMd) or twice the absolute value of Din (e.g., modulated digital input signal 112 of FIG. 1), |2*Din|.

In one example implementation, common mode reference signal 316 may range from 0 to 8, while a range of D1+D2 may be 0 to 16. Thus, second gain block 314 is included in the feedback path with a value of 0.5, to thereby reconcile the difference in ranges of common mode reference signal 316 and feedback signal D1+D2. Common mode reference signal 316 is treated as ranging from 0 to 8, even though it may actually range from 0 to 16, because it does so in increments of two. Common mode reference signal 316 ranges from 0 to 16 in increments of two because if there are 16 unit DAC elements, they are configured differentially in pairs. That is, if one unit DAC element is in a differential pair, another unit DAC element is included in the differential pair as well. If seven unit DAC elements are coupled to Vref, seven unit DAC elements are also be coupled to ground, thereby having 14 unit DAC elements configured in a differential manner.

Error 324 is received by first accumulator 302. First accumulator 302 (and further accumulators disclosed herein) performs an accumulation function (e.g., digitally adds a received input to a prior sum maintained by the accumulator; the received input is optionally scaled prior to adding). In this case, first accumulator 302 accumulates error 324. First accumulator 302 generates a first order error signal 326, which is received by second accumulator 304 and first gain block 312. First gain block 312 multiplies first order error signal 326 by a gain factor A (selected based on the particular implementation) to generate an amplified first order error signal 332. Second accumulator 304 integrates first order error signal 326 to generate a second order error signal 328. Second adder 310 receives and sums amplified first order error signal 332, second order error signal 328, common mode reference signal 316, and a dither signal 322 to generate a preliminary output signal 330. Dither signal 322 is a noise signal that is added in order to randomize quantization error. Dither signal 322 may have a value of one-half of a least significant bit of the input signal, e.g., +0.5 or –0.5. Dither signal 322 may be generated by a linear feedback shift register (LFSR) or another pseudo-random number generator, for example.

Preliminary output signal 330 is quantized by quantizer 306 to generate a common mode control signal 318. Quantizer 306 performs a rounding operation on preliminary output signal 330 to quantize preliminary output signal 330 and generate common mode control signal 318.

While using CM delta-sigma modulation to control common mode increases robustness, there may still be a drop in SNDR as the input signal begins to control the common mode. In this case, the feedback signal (actual common mode signal 320) is effectively decoupled from the common mode delta-sigma modulator loop, and there is effectively no feedback. When this happens, first accumulator 302 may saturate towards its negative rail. In an embodiment, this issue of the input controlling the common mode can be handled with an adaptive loop.

Figure 4:
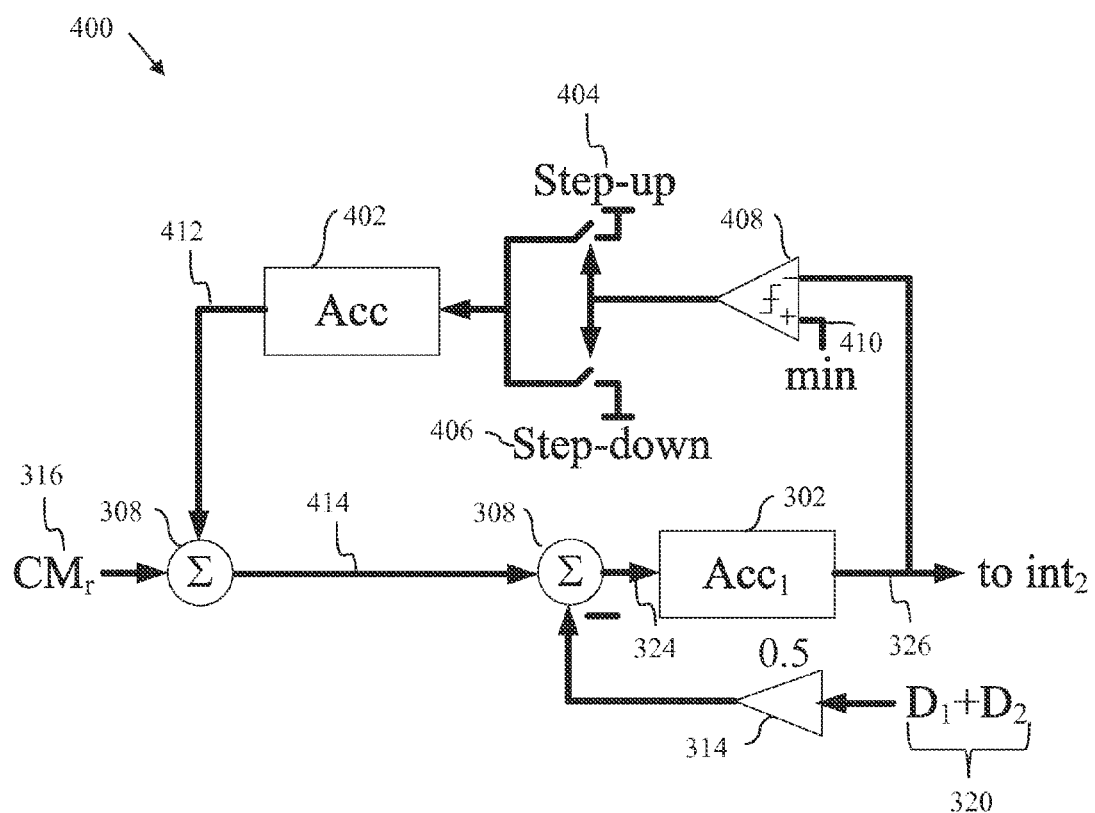
FIG. 4 depicts a block diagram of an adapted common mode delta-sigma modulator according to an exemplary embodiment.

For instance, FIG. 4 depicts a block diagram of an adapted common mode delta-sigma modulator 400 according to an exemplary embodiment. Adapted common mode delta-sigma modulator 400 is a modified form of common mode delta-sigma modulator 300 of FIG. 3 that is configured to adapt a common mode level to prevent saturation of CM delta-sigma modulator 400. For reasons of simplification, a portion of common mode delta-sigma modulator 300 of FIG. 3 is shown in FIG. 4 as adapted (the portion of common mode delta-sigma modulator 300 of FIG. 3 not shown in FIG. 4 may be the same). As shown in FIG. 4, adapted common mode delta-sigma modulator 400 includes first adder 308, first accumulator 302, second gain block 314, a third accumulator 402, a step-up value 404, a step-down value 406, and a comparator 408. These elements of FIG. 4 are described in further detail with respect to FIG. 5.

Figure 5:
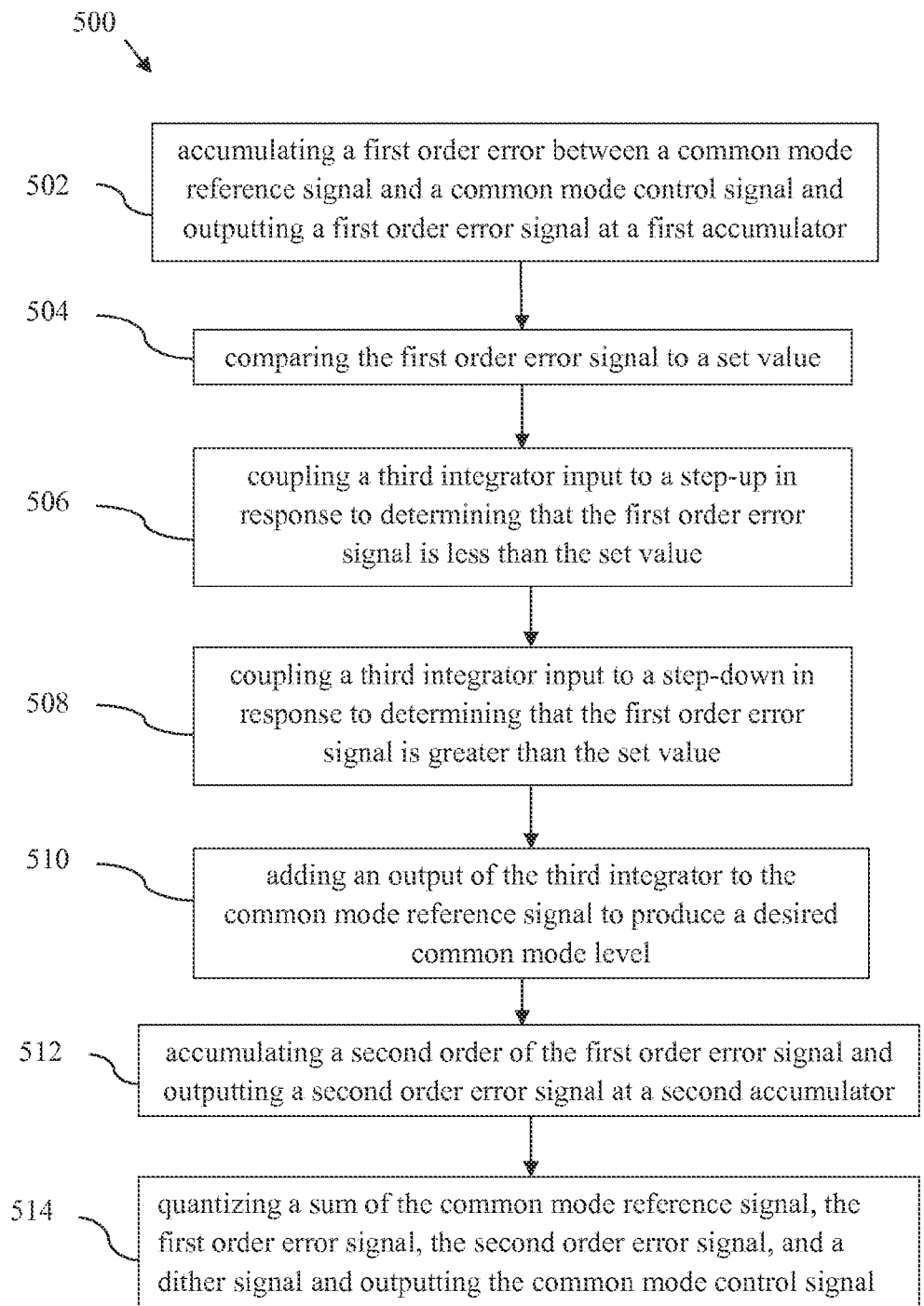
FIG. 5 depicts a flowchart of a search algorithm for the adapted common mode delta-sigma modulator of FIG. 4, according to an exemplary embodiment.

FIG. 5 depicts a flowchart 500 of a search algorithm for adapted common mode delta-sigma modulator 400 of FIG. 4, according to an exemplary embodiment. No order of steps is required unless expressly indicated or inherently required. There is no requirement that a method embodiment implement all of the steps illustrated in FIG. 5. For instance, some steps of flowchart 500 may be eliminated so that flowchart 500 describes operation of common mode delta-sigma modulator 300 of FIG. 3 (e.g., without the adaptive loop containing third accumulator 402 of FIG. 4). Flowchart 500 is simply one of many possible embodiments. Embodiments may implement fewer, more or different steps. Other structural and operational embodiments will be apparent to persons skilled in the relevant art(s) based on the description of flowchart 500. Flowchart 500 is described as follows with respect to CM delta-sigma modulators 300 and 400 of FIGS. 3 and 4, for illustrative purposes.

As shown in FIG. 5, flowchart 500 begins with step 502. In step 502, a first order error between a common mode reference signal and a common mode control signal is accumulated to generate a first order error signal. For example, as shown in FIG. 4, first accumulator 302 of FIG. 3 receives error signal 324 and accumulates errors between common mode reference signal 316 and actual common mode signal 320 (multiplied by 0.5 by second gain block 314) to generate first order error signal 326.

In step 504, the first order error signal is compared to a set value. For example, with respect to FIG. 4, first order error signal 326 is received and compared by comparator 408 to a predetermined value "min" 410.

In step 506, a third accumulator input is coupled to a step-up in response to determining that the first order error signal is less than the set value. For example, with respect to FIG. 4, an input to third accumulator 402 is coupled to step-up value 404 when it is determined that first order error signal 410 is less than set value min.

In step 508, the third accumulator input is coupled to a step-down in response to determining that the first order error signal is greater than the set value. For example, with respect to FIG. 4, an input to third accumulator 402 is coupled to step-down value 406 when it is determined that first order error signal 410 is greater than set value min. It is important to make sure that step-up value 404 is greater than step-down value 406. The reason for this is that if third accumulator 402 is connected to step-up value 404, the feedback loop is losing control of the common mode. In this case, the common mode is not controlled (rather, the common mode is controlled by the input signal) and somewhat rapid changes to the desired common mode level will not appear at the output of the DAC (e.g., DAC 106 of FIG. 1). As such, it is important in such a case to regain control of the common mode as quickly as possible. However, if the CM delta-sigma loop is operating correctly, any change to the desired common mode will be reflected in the output. Therefore, it is important to change the desired common mode in a fashion such that any spectral content added to the output signal falls outside the band of interest. Put another way, "step-up" may be set larger than "step-down" because if the CM level needs to be increased due to the input being too large (and therefore the input is setting the common mode level), then it is important to step up quickly, because nonlinearity is already being introduced from the modulated common mode. However, it is not desirable to step down too quickly, because stepping down too quickly introduces its own error, e.g., a jump in the output waveform results from stepping down too quickly. For example, a binary step-up value of $2^{-7}$ and a step down value of $2^{-20}$ may be used in some embodiments.

In step 510, an output of the third accumulator is added to the common mode reference signal to produce a desired common mode level. For example, with respect to FIG. 4, an accumulator output signal 412 generated by third accumulator 402 is added to common mode reference signal CMr 316 by adder 308 to produce a desired common mode level 414. In the embodiment of FIG. 4, when the adaptive loop containing accumulator 402 is present, desired common mode level 414 is generated as a modified version of common mode reference signal CMr 316. Adder 308 is shown in two parts in FIG. 4 for ease of illustration, but may instead be represented as a single adder that receives each of accumulator output signal 412, common mode reference signal CMr 316, and actual common mode signal 320 (divided in half).

In step 512, a second order of the first order error signal is accumulated and output at a second accumulator. For example, as shown in FIG. 3, first order error signal 326 is received by second accumulator 304 to generate a second order error signal 328.

In step 514, a sum of the common mode reference signal, the first order error signal, the second order error signal, and a dither signal are quantized and output as the common mode control signal. For example, with respect to FIG. 3, common mode reference signal CMr, first order error signal 326, second order error signal 328, and dither signal 322 are summed at adder 310 to generate preliminary output signal 330. Preliminary output signal 330 is received by quantizer 306, which quantizes preliminary output signal 330 to generate common mode control signal CMd 318.

It should be noted that the values of step-up value 404, step-down value 406, min 410, and CMr 316, may be tuned for particular desired system performance. For instance, using a relatively low value for CMr 316, low value for step-up value 404, and high value for min 410 may lead to lower power consumption, but may greatly increase distortion at the output of the DAC. In one example, for a 17 level unit DAC element, it was found that for CMr 316 having a value of 2 or 3, a step-up value 404 in the range of $2^{-7}$, a step-down value 406 in the range of $2^{-20}$, and a value of min 410 of 3 were sufficient to achieve a dynamic range of 124 dB for a −60 dBFS (Decibels relative to full scale) input, 90 dB THD+N (total harmonic distortion plus noise) for a −10 dBFS input, and 85 dB THD+N for a −2 dBFS input. This was assuming a 1% mismatch between Rs and Rf (e.g., first and second resistors 120 and 122 of FIG. 1).

When used as CM delta-sigma modulator 130 of FIG. 1, CM delta-sigma modulator 300 or 400 generates common mode control signal 318, which may be received by shuffler 104 of FIG. 1 as common mode control signal 126. It should be noted that CM delta-sigma modulators 300 and 400 may each include additional and/or alternative stages, or may be configured otherwise, in further embodiments.

The common mode is digitally programmable to allow for a tradeoff between distortion due to the desired common mode being too low compared to input signal amplitude, and too high, thereby wasting power. A search algorithm may be used to dynamically set the common mode based on the input signal.

C. Example Data Delta-Sigma Modulator Embodiments

As described above with respect to FIG. 1, system 100 includes a data delta-sigma modulator 102. Data delta-sigma modulator 102 receives a digital input signal 110, and is configured to generate a modulated digital input signal 112 based on delta-sigma modulation. A purpose for performing delta-sigma modulation is to re-create a high word length input signal using a short word length, oversampled, output signal. For instance, it may not be possible to build a 24 bit DAC. Therefore, delta-sigma modulation may be used to reduce the bit length of data symbols in digital input signal 110 to shorter bit length data symbols in modulated digital input signal 112 (e.g., reducing from 24 bits to 5 bits), while increasing the bit rate (e.g., from 48 kHz to 13 MHz). By using delta-sigma modulation, an effective 24 bit DAC may be configured using a smaller number of bits (e.g., 4 or 5 bits) that are operated on at a fast rate.

Data delta-sigma modulator 102 may implemented in various ways. For instance, FIG. 14 depicts a data delta-sigma modulator 1400 according to an exemplary embodiment. Data delta-sigma modulator 1400 is an example embodiment of data delta-sigma modulator 102 of FIG. 1. As shown in FIG. 14, data delta-sigma modulator 1400 includes an interpolator 1402, an adder 1404, a first accumulator 1406, a second adder 1408, a second accumulator 1410, a quantizer 1412, and a gain block 1414. Data delta-sigma modulator 1400 is described as follows.

As shown in FIG. 14, interpolator 1402 receives a digital input signal 1416 (Bin), such as a low speed (e.g., kilohertz range bits/second), high precision (e.g., high number of data bits per symbol, such as 24 bits) digital audio signal. For example, similar to digital input signal 110 of FIG. 1, digital input signal 1416 may be a 24 bit, 48 kHz audio signal. Interpolator 1402 interpolates digital input signal 1416 and outputs an interpolated digital input signal 1420 having a similar waveform as digital input signal 1416 but a much higher rate. For example, interpolator 1402 may generate a 24 bit, 13 MHz signal from a 24 bit, 48 kHz audio signal input. Interpolator 1402 may be configured to perform interpolation to create intermediate data symbols between data symbols received in digital input signal 1416 in any manner, as would be known to persons skilled in the relevant art, to generate the higher rate interpolated digital input signal 1420.

Interpolated digital input signal 1420 is received by adder 1404, and is thereby fed into a feedback loop created by adder 1404, first accumulator 1406, second adder 1408, second accumulator 1410, quantizer 1412, and gain block 1414, which generates a modulated digital input signal 1418 as an output of data delta-sigma modulator 1400, and modulated digital input signal 1418 is also fed back to first and second adders 1404 and 1408.

First adder 1404 receives and adds together interpolated digital input signal 1420 and modulated digital input signal 1418 to generate a first summed digital signal 1422. First accumulator 1406 receives and accumulates first summed digital signal 1422 to generate a first order digital signal 1424. Continuing the above example, based on a 24 bit, 48 kHz signal input, first order digital signal 1424 may be a 26 bit, 13 MHz digital signal.

Second adder 1408 receives and adds together first order digital signal 1424 and modulated digital input signal 1418, which is multiplied by 2 by gain block 1414, to generate a second summed digital signal 1426. Second accumulator 1410 receives and accumulates/integrates second summed digital signal 1426 to generate a second order digital signal

1428. Continuing the above example, based on a 26 bit, 13 MHz digital input signal, second order digital signal 1426 may be a 28 bit, 13 MHz digital signal.

Quantizer 1412 receives and quantizes, by rounding, second order digital signal 1428 to generate modulated digital input signal 1418. Modulated digital input signal 1418 includes data symbols having a shorter length, but a higher frequency. For example, modulated digital input signal 1418 may be a 4 or 5 bit, 13 MHz signal for a 28 bit, 13 MHz digital signal input.

When used as data delta-sigma modulator 102 of FIG. 1, data delta-sigma modulator 1400 generates modulated digital input signal 1418, which may be received by shuffler 104 of FIG. 1 as modulated digital input signal 112. It should be noted that data delta-sigma modulator 1400 may include additional and/or alternative stages, or may be configured otherwise, in further embodiments.

D. Example Shuffler Embodiments

If the unit DAC elements of a DAC are perfectly matched, then controlling the common mode may be sufficient to achieve acceptable performance. However, in practice, it is nearly impossible to achieve such a level of matching from the unit elements that make up a DAC (e.g., matching resistor values, etc.). Thus, in order to improve performance, dynamic element matching (DEM) may be used. DEM uses shuffling in order to equally use the unit DAC elements of a DAC over time. By using the unit DAC elements of a DAC equally over time, mismatches in the unit DAC elements may be averaged out and mismatch errors are translated into shaped noise. While this is true for two-level unit DAC elements, in a tri-level unit DAC element, it may be desirable for the common mode to be controlled in this manner as well as the input data stream. In an embodiment, to control the common mode and encode and shuffle the input data, a new tree shuffler is described as follow.

Figure 6:
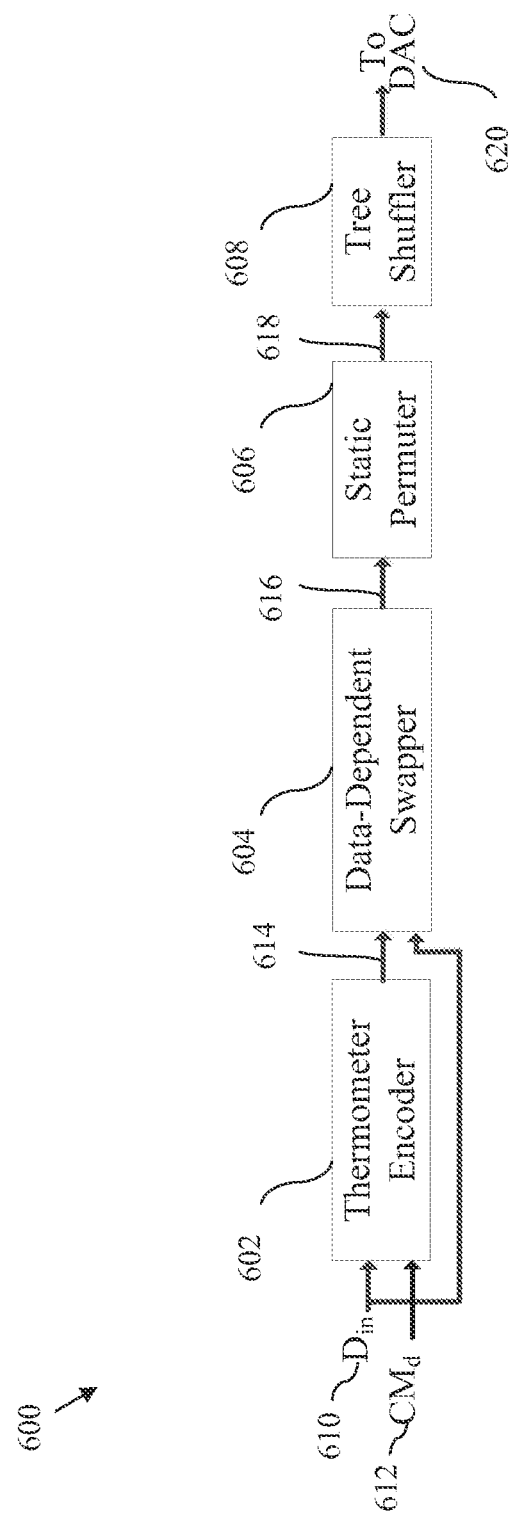
FIG. 6 depicts a block diagram of a tri-level DAC data shuffler according to an exemplary embodiment.

For instance, FIG. 6 depicts a block diagram of a tri-level DAC data shuffler 600, according to an exemplary embodiment. As shown in FIG. 6, tri-level DAC data shuffler 600 includes a thermometer encoder 602, a data-dependent swapper 604, a static permuter 606, and a tree shuffler 608. Tri-level DAC data shuffler 600 is, operationally, divided into two parts. The first part receives a binary input and vector encodes it, such that the vector contains only unit element symbols. This is done by thermometer encoder 602, data-dependent swapper 604, and the static permuter 606. Common mode control is entirely handled by this first part. The second part accomplishes the actual data-dependent shuffling, which is performed by tree shuffler 608. The common mode adjustment of the DAC signal is handled by adding in a combination of complementary symbols into the input data vector. This removes any common mode requirements from the shuffler itself. Thus, the actual shuffling and the handling of the common mode are effectively separated. Separation of the shuffling and controlling the common mode can give some extra degree of control over the shuffler, particularly if one wishes to program the order of the shuffling.

Figure 7:
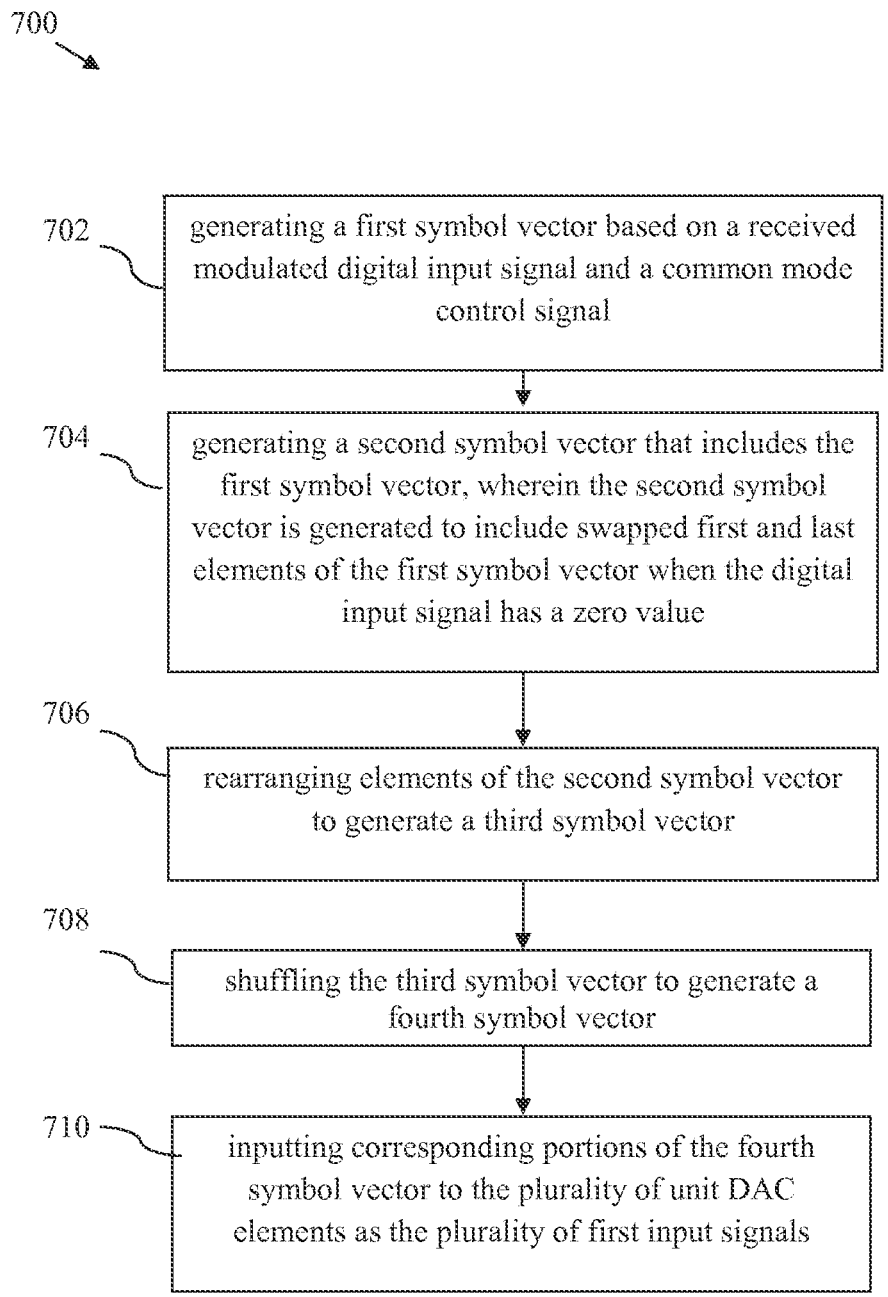
FIG. 7 depicts a flowchart of a method for shuffling a digital input signal according to an exemplary embodiment.

The elements of FIG. 6 are described as follows in greater detail in conjunction with FIG. 7. FIG. 7 depicts a flowchart 700 for shuffling a digital input signal according to an exemplary embodiment. No order of steps is required unless expressly indicated or inherently required. There is no requirement that a method embodiment implement all of the steps illustrated in FIG. 7. Flowchart 700 is simply one of many possible embodiments. Embodiments may implement fewer, more or different steps. Other structural and operational embodiments will be apparent to persons skilled in the relevant art(s) based on the description of flowchart 700. Flowchart 700 is described as follows with respect to FIG. 6 for purposes of illustration.

As shown in FIG. 7, flowchart 700 starts with step 702. In step 702, a first symbol vector is generated based on a received modulated digital input signal and a common mode control signal. For instance, as shown in FIG. 6, thermometer encoder 602 receives modulated digital input signal 610 (Din) and common mode control signal 612 (CMd) and outputs a first symbol vector 614. With reference to FIG. 1, modulated digital input signal 610 is an example of modulated digital input signal 112 and common mode control signal 612 is an example of common mode control signal 126. In an embodiment, thermometer encoder 602 may operate in the following manner to encode an input signal: Start with a zero-filled vector. Fill the first |2Din| entries with a data symbol that best represents Din. In the case of a tri-level DAC, the first |2Din| entries should be filled with sign(Din). The rest of the entries of the vector can be arbitrarily filled to generate first symbol vector 614. However, the other entries should be filled such that their net effect on the output is null. For example, given that N satisfies the equation |2Din|+N<M, where M is the number of entries in the vector and, equivalently, M is the number of unit DAC elements, after the first |2Din| entries have been filled, the next N/2 entries can be filled with −sign (Din). After that, the next N/2 entries can be filled with sign (Din), and the remaining entries can be left as 0, to generate first symbol vector 614.

In one example, if the input Din is 2, there may be at least 2 DAC elements encoding a positive output, and the remaining elements sum up to 0. To encode this, the first 2 vector entries are assigned as sign(Din), or 1, so the vector starts out looking like: {1, 1, 0, 0, . . . , 0}. The next N/2 entries would be filled with −sign(Din) or −1. Then, the next N/2 entries would be filled with sign(Din) or 1, then the remaining entries would be filled with 0s. The net effect is a symbol vector representing the input Din, or 2.

In step 704, a second symbol vector is generated that includes the first symbol vector, wherein the second symbol vector is generated to include swapped first and last elements of the first symbol vector when the digital input signal has a zero value. For instance, as shown in FIG. 6, data-dependent swapper 604 receives modulated digital input signal 610 and first symbol vector 614 and generates a second symbol vector 616. Data-dependent swapper 604 handles a special case of input, in particular when the input is a "0" vector. A "0" input tends to make shuffling difficult, and in order to enhance the shuffling effect, data-dependent swapper 604 checks if Din=0 (if modulated digital input signal 610 is zero). If so, data-dependent swapper 604 swaps the first and last elements of first data vector 614 to generate second symbol vector 616. If Din is not equal to zero, data-dependent swapper 604 outputs first symbol vector 614 as second symbol vector 616.

In step 706, elements of the second symbol vector are rearranged to generate a third symbol vector. For example, as shown in FIG. 6, static permuter 606 receives and rearranges elements of second symbol vector 616 according to a permutation to generate a third symbol vector 618. This permutation is independent of digital input signal input 610. FIG. 15 shows a permutation algorithm 1500 according to an exemplary embodiment. Permutation algorithm 1500 may be performed by static permuter 606, as follows:

For B layers of permuting and M vector entries (M data vectors received in second symbol vector 616):

For $1^{st}$ layer 1502, even entries 1504 of second symbol vector 616 become the top M/2 entries 1508, odd entries

1506 become the bottom M/2 entries 1510. These two M/2-symbol vectors 1508 and 1510 form an M-symbol vector 1530, with the "even entries" on top and the "odd entries" on the bottom (although it should be noted that whether even entries go on top or bottom is arbitrary);

For $2^{nd}$ layer 1512, for the top M/2 entries 1508 of first layer 1502, the even entries 1514 become the top M/4 entries 1518, and the odd entries 1516 become the bottom M/4 entries 1520; and For the bottom M/2 entries 1510 of first layer 1502, the even entries 1522 become the top M/4 entries 1526, and the odd entries 1524 become the bottom M/4 entries 1528. These four M/4-symbol vectors 1518, 1520, 1526, and 1528 combine to form another M-symbol vector 1532.

This pattern may be followed for a number of B layers, where B=log 2(M)−1. However, in some embodiments, the implementation is not layered. This is deterministic and can be calculated ahead of time. The permutation performed by static permuter 606 is important for shuffling. Actual data-dependent shuffling occurs at tree shuffler 608, as further described below.

Referring back to FIG. 7, in step 708, the third symbol vector is shuffled to generate a fourth symbol vector. For example, as shown in FIG. 6, tree shuffler 608 receives third symbol vector 618 and shuffles third symbol vector 618 to generate a fourth symbol vector 620. Tree shuffler 608 may be configured in various ways to shuffle third symbol vector 618 to generate fourth symbol vector 620.

Figure 8:
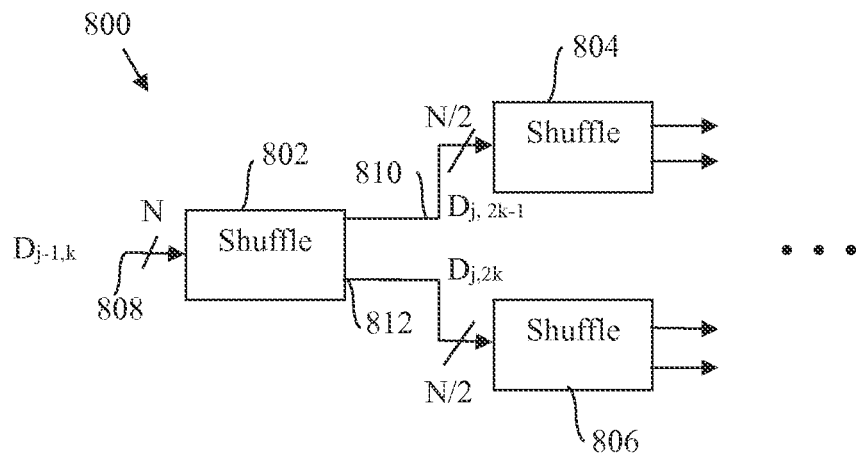
FIG. 8 depicts a block diagram of a shuffler according to an exemplary embodiment.

For instance, FIG. 8 depicts a block diagram of a tree shuffler 800, according to an exemplary embodiment. Tree shuffler 608 of FIG. 6 may be implemented by tree shuffler 800 of FIG. 8, in an embodiment. Tree shuffler 800 of FIG. 8 includes B layers (two layers are actually shown in FIG. 8). Each layer of the B layers is built from $2^{n-1}$ shuffling blocks, where n is the layer index. The first (n=1) layer has one shuffling block, the second (n=2) layer has 2 shuffling blocks, and so on up to B layers. For example, a first layer (n=1) of tree shuffler 800 shown in FIG. 8 includes shuffle block 802, and a second layer (n=2) of tree shuffler 800 includes shuffle blocks 804 and 806. A next, third layer (n=3) of tree shuffler 800 (not shown in FIG. 8) includes four shuffle blocks, etc.

As shown in FIG. 8, shuffle block 802 receives a vector 808 of N-symbols, and outputs two vectors 810, 812 of N/2 symbols each. Vector 808 is an example of a data vector such as first data vector 614 of FIG. 6. However, FIG. 8 is shown at an arbitrary point in shuffle block 804. Shuffle block 804 receives vector 810 of N/2 symbols and outputs two vectors of N/4 symbols each. Shuffle block 806 receives vector 812 of N/2 symbols and outputs two vectors of N/4 symbols each. Each shuffle blocks in a next layer of tree shuffler 800 receives a preceding vector of symbols (e.g., N/2 symbols), and outputs two vectors that are each one half of length of the received symbol vector (e.g., N/4 symbols).

Output vectors 810 and 812 are constructed of either the top half or bottom half of input vector 808. For each shuffle block of each layer, each of the two output vectors comprises either the top half or the bottom half of the input vector of that block. Internal to each shuffle block is a delta-sigma modulator, which determines whether the top half of the input vector is the top output of the shuffle block or the bottom. The other output is the opposite half of the input vector. Shuffle blocks 802, 804, and 806 may be configured in various ways to perform these functions.

Figure 9:
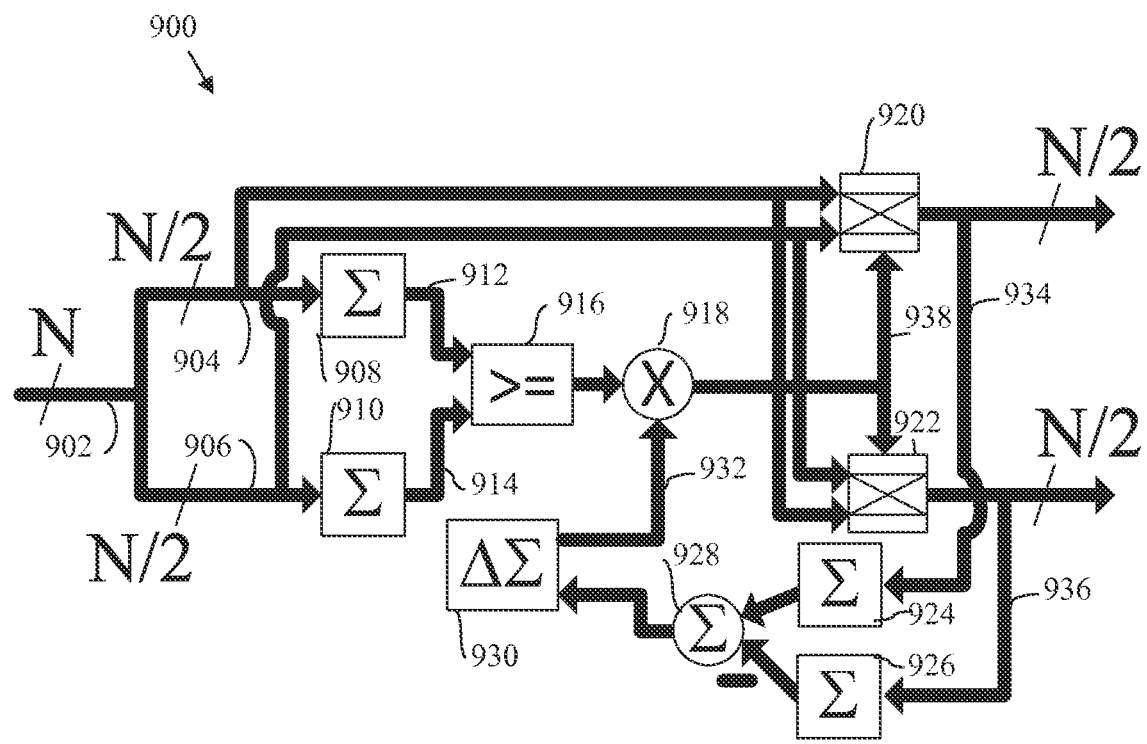
FIG. 9 depicts a block diagram of a shuffle block according to an exemplary embodiment.

For instance, FIG. 9 depicts a block diagram of a shuffle block 900, according to an exemplary embodiment. Shuffle blocks 802, 804, and 806 of FIG. 8 may each be implemented by shuffle block 900 of FIG. 9, in an embodiment. As shown in FIG. 9, shuffle block 900 includes adder 928, vector adders 908, 910, 924, and 926, a comparator 916, a multiplier 918, a first selector 920, a second selector 922, and an internal delta-sigma modulator 930. Shuffle block 900 is described as follows.

An input vector 902 of N symbols is received. Input vector 902 is an example of one of input vector 808, vector 810, or vector 812. Input vector 902 is immediately split into 2, N/2-symbol vectors 904 and 906. The N/2-symbol vectors 904 and 906 are composed of the top half and bottom half of the N-symbol input vector 902. Elements of each vector 904 and 906 are respectively summed at vector adders 908 and 910 to obtain a value for vectors 904 and 906 (e.g., a vector adder adds together the elements of a vector to generate a single number result). The two vector values are compared against each other at comparator 916. Delta-sigma modulator 930 chooses, based upon past choices, whether to send one of vectors 904 and 906 determined by comparator 916 to be the larger vector to the top output (output vector 934) or the bottom output (output vector 936). This may be performed by a single bit delta-sigma modulator output signal 932 generated by delta-sigma modulator 930, for example.

For instance, multiplier 918 may be configured to combine delta-sigma modulator output signal 932 with the determination made by comparator 916 to generate a select signal 938. Select signal 938 indicates which of vectors 904 and 906 is to be output as output vector 934, and which of vectors 904 and 906 is to be output as output vector 936. Select signal 938 is received by first and second selectors 920 and 922, which each also receive vectors 904 and 906. Based on the determination made by comparator 916, and on delta-sigma modulator output signal 932, either first selector 920 outputs vector 904 on output vector 934 and second selector 922 outputs vector 906 on output vector 936, or first selector 920 outputs vector 906 on output vector 934 and second selector 922 outputs vector 904 on output vector 936.

As shown in FIG. 9, delta-sigma modulator 930 receives as feedback a difference in value between the values of output vectors 934 and 936 by way of adders 924, 926, and 928. That is, vector adder 924 sums the elements of output vector 934 to generate a first single value and vector adder 926 sums the elements of output vector 936 to obtain a second single value. Adder 928 sums (actually, subtracts) the first and second single values to obtain a difference in value between the first and second single values. This difference in value information may be used to make further decisions by delta-sigma modulator 930 on which of vectors 904 and 906 to output on output vectors 934 and 936. Note that output vectors 934 and 936 are examples of vectors 810 and 812 (and other shuffle block output vector pairs) shown in FIG. 8.

In an embodiment, an order of the delta-sigma modulator within each shuffle block determines the overall mismatch shaping. For instance, if a 2nd order delta-sigma modulator is used, then the mismatch shaping will tend to be 2nd order. However, delta-sigma modulator saturation can limit the effectiveness of the shuffling. This can be a limitation in all delta-sigma based DEM methods.

Referring back to FIG. 7, in step 710, corresponding portions of the fourth symbol vector are input to a plurality of unit DAC elements as a plurality of first input signals. For instance, fourth symbol vector 620 may be output to a DAC such as DAC 106 of FIG. 1 for conversion to an analog signal.

E. Example Tri-Level DAC Embodiments

As described above, tri-level DAC 106 receives shuffled digital input signal 114 and generates a first output signal 116 at a first output thereof and a second output signal 118 at a second output thereof, which form a differential output signal. Tri-level DAC 106 includes a network of unit element DACs, such as those described above. Tri-level DAC 106 may be configured in various ways.

Figure 10:
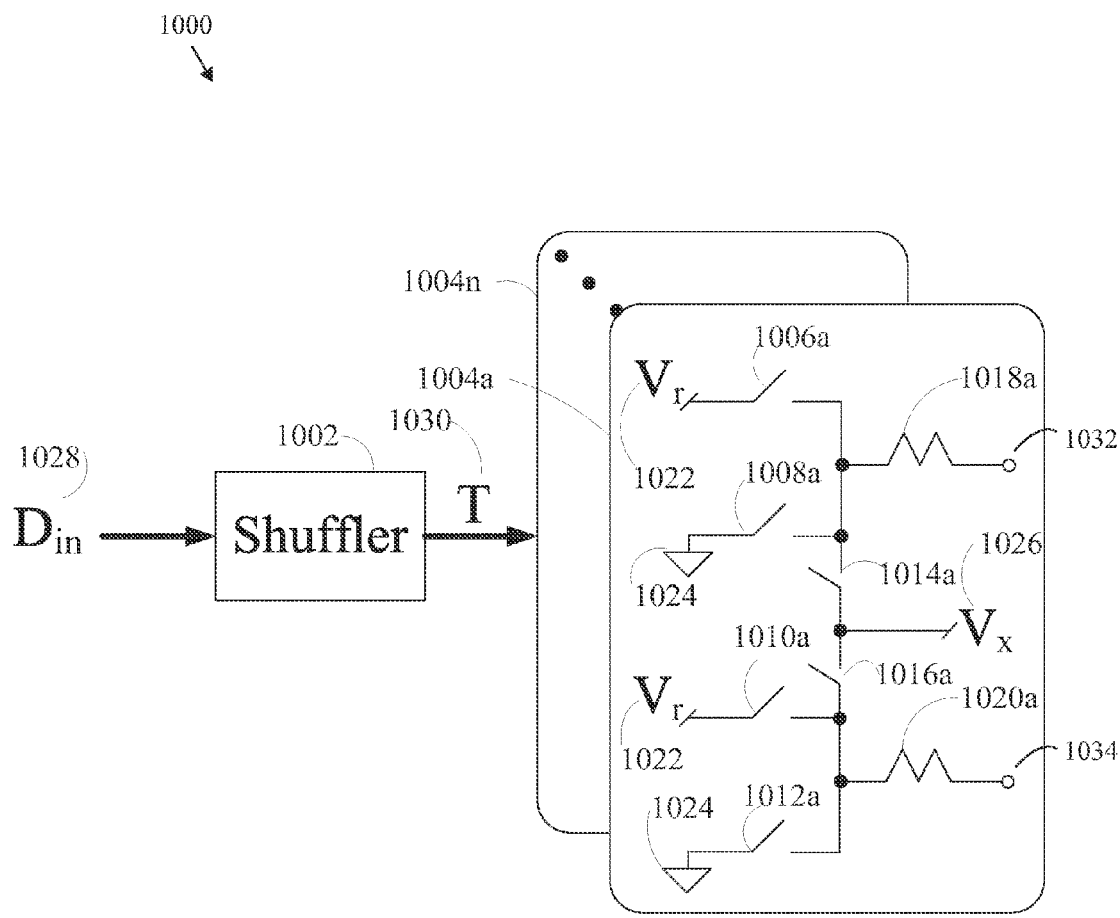
FIG. 10 depicts a block diagram of a tri-level digital to analog converter (DAC) according to an exemplary embodiment.

For instance, FIG. 10 depicts a block diagram of a tri-level DAC 1000, according to an exemplary embodiment. Tri-level DAC 1000 is an example of tri-level DAC 106 of FIG. 1. Furthermore, a shuffler 1002 is shown in FIG. 10, which is an example of shuffler 104 of FIG. 1. As shown in FIG. 10, tri-level DAC 1000 includes tri-level unit DAC elements 1004a-1004n. Tri-level unit DAC elements 1004a-1004n are coupled in parallel. Any number of unit DAC elements 1004a-1004n may be present, depending on the particular implementation. Tri-level DAC 1000 is described as follows.

As shown in FIG. 10, tri-level unit DAC element 1004a includes switches 1006a, 1008a, 1010a, 1012a, 1014a, and 1016a, a first resistor 1018a and a second resistor 1020a. Switches 1006a and 1010a each have a first end (e.g., a terminal, a node, a conductor, etc.) coupled to a first reference voltage Vr 1022. In the example of FIG. 10, switches 1008a and 1012a each have a first end coupled to a second reference voltage 1024 (e.g., ground, although in other embodiments, a different reference voltage than ground may be used). Switches 1014a and 1016a each have a first end coupled to a reference voltage Vx 1026 (a third reference voltage). A first end of first resistor 1018a may be coupled to first reference voltage 1022, second reference voltage 1024, or third reference voltage 1026 depending on a state of switches 1006a, 1008a, and 1014a. A first end of second resistor 1020a may be coupled to one of first-third reference voltages 1022, 1024, or 1026 depending on a state of switches 1010a, 1012a, and 1016a. Each of tri-level unit DAC elements 1004a-1004n may be configured similarly to tri-level unit DAC element 1004a, and may operate similarly to tri-level unit DAC element 1004a as described herein. Accordingly, each of tri-level unit DAC elements 1004a-1004n may include correspondingly numbered switches and resistors (e.g., tri-level unit DAC element 1002b may include first and second resistors 1018b and 1020b and switches 1006b, 1008b, 1010b, 1012b, 1014b, and 1016b). Second ends of the first resistors (1018a, 1018b, etc.) of tri-level unit DAC elements 1004a-1004n are coupled together at a first DAC output 1032. Second ends of the second resistors (e.g., 1020a, 1020b, etc.) of tri-level unit DAC elements 1004a-1004n are coupled together at a second DAC output 1034. First and second output signals 116 and 118 of FIG. 1 may be output at first and second DAC outputs 1032 and 1034, in an embodiment.

Shuffler 1002 receives a digital input signal 1028 (Din) as input, and produces a shuffled digital input signal 1030 (T) as output. Digital input signal 1028 is an example of shuffled digital input signal 114 of FIG. 1. Shuffler 1002 may be implemented by tri-level DAC data shuffler 600 of FIG. 6, or according to another shuffler configuration. Although not explicitly shown, a respective portion (e.g., a respective bit) of shuffled audio signal 1030 is input to each of tri-level unit DAC elements 1004a-1004n as a first input signal. Although not shown, second and third input signals are input into tri-level unit DAC elements 1004a-1004n. The second input signal may be an inverted version of the first input signal, and the third input signal may be a common mode control signal, such as common mode control signal 126 of FIG. 1. The first, second, and third input signals control a state of switches 1006a, 1008a, 1010a, 1012a, 1014a, and 1016a. Tri-level unit DAC elements 1004a-1004n can each take on one of three possible logical values: "−1", "1", and "0".

For instance, FIGS. 11a-11c depict examples of a tri-level unit DAC elements similar to tri-level unit DAC element 1004a that are encoding different levels, according to exemplary embodiments. In FIGS. 11a-11c, switches 1006a, 1008a, 1010a, 1012a, 1014a, and 1016a of FIG. 10 are shown (unlabeled in FIGS. 11b-11c for ease of illustration) and receive input signals A, B, C, D, E, and E, respectively. Input signals A and D are the same and generally have the value of the first input signal (based on logic), input signals B and C are the same and generally have the value of the second input signal, and input signal E generally has the value of the third input signal. As such, in FIGS. 11a-11c, the states of the switches are controlled by the first, second and third input signals.

In FIG. 11a, a tri-level unit DAC element 1100a is shown encoding a "−1." In order to encode a "−1," input signals A and D cause switches 1006a and 1012a to be closed, and input signals B, C, and E cause switches 1008a, 1010a, 1014a, and 1016a to be opened. When switches 1006a and 1012a are closed and switches 1008a, 1010a, 1014a, and 1016a are open, first resistor 1018 is coupled to Vr and second resistor 1020 is coupled to ground.

In FIG. 11b, a tri-level unit DAC element 1100b is shown encoding a "1." In order to encode a "1," input signals B and C cause switches 1008a and 1010a to be closed, and input signals A, D, and E cause switches 1006a, 1012a, 1014a, and 1016a to be open. When switches 1008a and 1010a are closed and switches 1006a, 1012a, 1014a, and 1016a are open, first resistor 1018 is coupled to ground and second resistor 1020 is coupled to Vr.

In FIG. 11c, a tri-level unit DAC element 1100c is shown encoding a "0." In order to encode a "0," input signal E causes switches 1014a and 1016a to be closed, and input signals A, B, C, and D cause switches 1006a, 1008a, 1010a, and 1012a, to be open. When switches 1014a and 1016a are closed and switches 1006a, 1008a, 1010a, and 1012a are open, first resistor 1018 is coupled to Vx and second resistor 1020 is coupled to Vx.

It is noted that logic may be present in tri-level unit DAC elements to convert the first, second, and third input signals to input signals A-E. For instance, input signals A and D may be equal to the first input signal, and input signals B and C may be equal to the second input signal, except for when the third input signal is high. When the third input signal is high, input signals A-D are forced to a same state (e.g., low) to cause switches 1006a, 1008a, 1010a, and 1012a to all be open.

It should be noted that although FIGS. 10 and 11a-11c depict switched resistor unit DAC elements 1004a-1004n, in some embodiments, unit DAC elements 1004a-1004n may be configured in other ways. For instance, in an embodiment, resistors 1018 and 1020 may be replaced with another type of component, such as capacitors, to form switched capacitor unit DAC elements. In another embodiment, switched resistor unit DAC elements 1004a-1004n may be replaced with current steering unit DAC elements.

Furthermore, it is noted that FIG. 10 shows a differential version of tri-level DAC 1000. In an alternative embodiment, tri-level DAC 1000 may be single-ended. For instance, in such an embodiment, each tri-level DAC element 1004 may be configured similarly to tri-level DAC element 1004a shown in FIG. 10, except that switches 1010a, 1012a, and 1020a are not present, and resistor 1020a (or alternate component) is not present. In such an embodiment, tri-level DAC 1000 may have first DAC output 1032 as a single output (second DAC output 1034 is not present). In such a single-ended embodiment, First DAC output 1032 may be coupled to an amplifier (e.g., op-amp 108 of FIG. 1) in any manner. For instance, first DAC output 1032 may be coupled to an inverting input of the amplifier (e.g., with the non-inverted input of the amplifier coupled to a common mode voltage, ground, or other voltage). Alternatively, first DAC output 1032 may be coupled to a non-inverting input of the amplifier, with the amplifier configured in a unity gain feedback or other configuration.

Tri-level DAC 1000 of FIG. 10 may interface with an output driver in any manner, in embodiments. For instance, FIG. 12 depicts a block diagram of tri-level DAC 1000 coupled to a driver 1200, according to an exemplary embodiment. Tri-level DAC 1000 and driver 1200 of FIG. 12 show how unit DAC elements 1004a-1004n of FIG. 10 may be used in an audio output driver. Tri-level DAC 1000 and driver 1200 are described as follows.

As described above, in an embodiment, the input to a tri-level DAC may be encoded as 2Din=D1−D2, but in this case, D1+D2+D3=M. M is the total number of unit element DACs, D1 is the number of unit DAC elements having a first output voltage value, D2 is the number of unit DAC elements having a second output voltage value, and D3 is the number of unit DAC elements having the third output voltage value, based on the three input signal values. As shown in FIG. 12, tri-level DAC 1000 includes a first set of resistors that correspond to resistors 1018a-1018n (collectively, 1018) of FIG. 10, a second set of resistors that correspond to resistors 1020a-1020n (collectively, 1020) of FIG. 10. Furthermore, driver 1200 includes a differential to single ended operational amplifier 1202, a feedback resistor (Rf) 1204 and a dividing resistor (Rs) 1206.

As such, FIG. 12 uses the notation of "R/D1", "R/D2", and "R/D3" to represent a combination of a number M of unit DAC elements 1004a-1004n present, where M=D1+D2+D3. According to the representation of the unit DAC elements 1004a-1004n in FIG. 12, there is a number of D1 of resistors 1018 having a first end coupled to second reference voltage 1024, and a number of D1 of resistors 1020 having a first end coupled to first reference voltage 1022. There is a number of D2 of resistors 1018 having a first end coupled to first reference voltage 1022, and a number of D2 of resistors 1020 having a first end coupled to second reference voltage 1024. Furthermore, there is a number of D3 of resistors 1018 and a number of D3 of resistors 1020 having a first end coupled to third reference voltage 1026.

As shown in FIG. 12, a second end of each of resistors 1018 is coupled together and input to an inverting input of operational amplifier 1202. A second end of each of resistors 1020 is coupled together and input to a non-inverting input of operational amplifier 1202. Dividing resistor 1206 is coupled between the non-inverting input of operational amplifier 1202 and reference voltage 1024 (e.g., ground). An analog output signal (Vo) 1208 generated by operational amplifier 1202 is fed back from an output of operational amplifier 1202 to the inverting input through feedback resistor 1204. Based on the number of resistors 1018 and 1020 coupled to each of the first-third reference voltages 1022-1026, and the values of resistors 1018, 1020, 1202, and 1204, analog output voltage 1208 is generated by op-amp 1202. As such, operational amplifier 1202 serves to convert reference voltages applied by digitally selected resistances into an analog output signal 1208.

In FIG. 12, for small input signals, most elements (e.g., resistors 1018 and 1020) can be switched to Vx, which can be a low voltage (e.g., near or equal to ground), leaving relatively few elements connected to Vr. This implies a larger resistance between Vr and ground, reducing the overall current consumption of the DAC. Therefore, in this manner, static power dissipation in tri-level DAC 1000 can be reduced. Furthermore, with most elements connected to Vx, and assuming an output voltage Vo of operational amplifier 1202 is referenced to ground, the voltages across resistors Rf and Rs are reduced, decreasing the flicker noise in these elements.

FIG. 13 depicts a flowchart 1300 for converting a digital input signal to an analog output signal according to an exemplary embodiment. Flowchart 1300 may be implemented, for example, by tri-level DAC 1000 of FIG. 10 or FIG. 12. No order of steps is required unless expressly indicated or inherently required. There is no requirement that a method embodiment implement all of the steps illustrated in FIG. 13. Flowchart 1300 is simply one of many possible embodiments. Embodiments may implement fewer, more or different steps. Other structural and operational embodiments will be apparent to persons skilled in the relevant art(s) based on the description of flowchart 1300. Flowchart 1300 is described as follows with respect to FIGS. 10 and 11a-11c for purposes of illustration.

As shown in FIG. 13, flowchart 1300 starts with step 1302. In step 1302, first, second, and third reference voltages are received at each of a plurality of unit digital-to-analog converter (DAC) elements included in a DAC. For example, first, second and third reference voltages 1022, 1024, and 1026 (e.g., Vr, ground, and Vx) may be input to each of unit DAC elements 1004a-1004n of tri-level DAC 1000 of FIG. 10.

In step 1304, a plurality of first input signals are received at the plurality of unit DAC elements. For example, as shown in FIGS. 11a-11c, unit DAC elements 1100a, 1100b, and 1100c receive a first input signal at switches 1006a and 1012a as input signals A and D.

In step 1306, a plurality of second input signals are received at the plurality of unit DAC elements. For example, as shown in FIGS. 11a-11c, unit DAC elements 1100a, 1100b, and 1100c receive a second input signal at switches 1008a and 1010a as input signals B and C. In an embodiment, the second input signal may be an inverted version of the first input signal (except when the third input signal is high, forcing the first and second input signals low).

In step 1308, a plurality of third input signals are received at the plurality of unit DAC elements. For example, as shown in FIGS. 11a-11c, unit DAC elements 1100a, 1100b, and 1100c receive a third input signal at switches 1014a and 1016a as input signal E.

In step 1310, a first output signal is generated at the first DAC output and a second output signal is generated at the second DAC output based on the first, second, and third input signals received by the plurality of unit DAC elements. For example, as shown in FIG. 10, for each unit DAC element, a first output signal may be generated at first DAC output 1032 and a second output signal may be generated at second DAC output 1034 based on the first-third input signals that control switches 1006a, 1008a, 1010a, 1012a, 1014a, and 1016a. First DAC outputs 1032 of all of tri-level unit DAC elements 1004a-1004n are coupled together to generate a first DAC output signal (e.g., first output signal 116 of FIG. 1), and the second DAC outputs 1034 of all of the unit DAC elements are coupled together to form a second DAC output signal (e.g., second output signal 118 of FIG. 1).

CONCLUSION

A device (i.e., apparatus), as defined herein, is a machine or manufacture as defined by 35 U.S.C. §101. Devices may be digital, analog or a combination thereof. Some devices may be implemented with a semiconductor process or semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such alternative devices may require alternative configurations other than the configuration illustrated in embodiments presented herein.

Techniques, including methods, described herein may be implemented by hardware (digital and/or analog) or a combination of hardware with software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable storage media. Examples of such computer-readable storage media include, but are not limited to, a hard disk, a removable magnetic disk, a removable optical disk, flash memory cards, digital video disks, random access memories (RAMs), read only memories (ROM), and the like. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable storage media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Such computer-readable storage media are distinguished from and non-overlapping with communication media (do not include communication media). Communication media typically embodies computer-readable instructions, data structures, program modules or other data in a modulated data signal such as a carrier wave. By way of example, and not limitation, communication media includes wireless media such as acoustic, RF, infrared and other wireless media, as well as signals transmitted over wires. Embodiments are also directed to such communication media.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:
1. A tri-level digital to analog converter (DAC) comprising:
 a plurality of unit DAC elements coupled in parallel, each unit DAC element comprising:
  first, second, and third switches, the first switch being controlled by a first input signal, the second switch being controlled by a second input signal, and the third switch being controlled by a third input signal; and
  a first component that has a first terminal and a second terminal;
  the first switch coupled between a first reference voltage and the first terminal of the first component,
  the second switch coupled between a second reference voltage and the first terminal of the first component, and
  the third switch coupled between a third reference voltage and the first terminal of the first component; and
 the second terminals of the first components of the plurality of unit DAC elements are coupled together to generate a first output signal.

2. The tri-level DAC of claim 1, wherein the first component comprises a first resistor.

3. The tri-level DAC of claim 1, wherein the first component comprises a first capacitor.

4. The tri-level DAC of claim 1, wherein the first reference voltage is a positive voltage, the second reference voltage is a voltage less than the first reference voltage, and the third reference voltage is a voltage between the first reference voltage and the second reference voltage inclusive.

5. The tri-level DAC of claim 1, wherein the first terminal of the first component is coupled to the first reference voltage when the first input signal is in a first state and the second and third input signals are in a second state, the first terminal of the first component is coupled to the second reference voltage when the second input signal is in the first state and the first and third input signals are in the second state, and the first terminal of the first component is coupled to the third reference voltage when the third input signal is in the first state and the first and second input signals are in the second state.

6. A system for converting a digital input signal to an analog output signal, the system comprising:
 a common mode delta-sigma modulator configured to receive a common mode reference signal and generate a common mode control signal;
 a data delta-sigma modulator configured to receive a digital input signal and generate a delta-sigma modulated digital input signal;
 a shuffler configured to receive the delta-sigma modulated digital input signal and the common mode control signal, and to generate a shuffled digital input signal; and
 a digital to analog converter (DAC) comprising a plurality of tri-level unit DAC elements each configured to receive a corresponding portion of the shuffled digital input signal as a first input signal, to receive a second input signal, and to receive a third input signal, the plurality of tri-level unit DAC elements having first outputs coupled together to generate a first output signal; and an operational amplifier configured to receive the first output signal at an input, and to generate the analog output signal.

7. The system of claim 6, wherein each unit DAC element comprises:
first, second, and third switches, the first switch being controlled by the first input signal, the second switch being controlled by the second input signal, and the third switch being controlled by the third input signal, and
a first component that has a first terminal and a second terminal;
the first switch coupled between a first reference voltage and the first terminal of the first component,
the second switch coupled between a second reference voltage and the first terminal of the first component, and
the third switch coupled between the third reference voltage and the first terminal of the first component;
wherein the second terminals of the first components of the plurality of unit DAC elements are coupled together to generate the first output signal.

8. The system of claim 6, wherein the shuffler comprises:
a thermometer encoder configured to receive the delta-sigma modulated digital input signal and the common mode control signal, and to generate a first symbol vector;
a data-dependent swapper configured to receive the delta-sigma modulated digital input signal and the symbol vector, and to generate a second symbol vector that includes the first symbol vector, the second symbol vector generated to include swapped first and last elements of the first symbol vector when the delta-sigma modulated digital input signal has a zero value;
a static permutater configured to receive and rearrange elements of the second symbol vector to generate a third symbol vector; and
a tree shuffler configured to shuffle the third symbol vector to generate a fourth symbol vector.

9. The system of claim 6, wherein the common mode delta-sigma modulator comprises:
a first accumulator that accumulates a first order error between the common mode reference signal and the common mode control signal and generates a first order error signal;
a second accumulator that accumulates a second order of the first order error and generates a second order error signal; and
a quantizer that quantizes a sum of the common mode reference signal, the first order error signal, the second order error signal, and a dither signal and generates the common mode control signal.

10. The system of claim 9, wherein the common mode delta-sigma modulator further comprises:
a comparator configured to compare the first order error signal to a set value; and
a third accumulator having an input thereto;
wherein the input to the third accumulator is coupled to a step-up value in response to determining that the first order error signal is less than the set value,
wherein the input to the third accumulator is coupled to a step-down value in response to determining that the first order error signal is greater than the set value, and
wherein an output of the third accumulator is coupled to an input of the first accumulator.

11. The system of claim 7, wherein the first component comprises a first resistor.

12. The system of claim 7, wherein the first component comprises a first capacitor.

13. A method for converting a digital input signal to an analog output signal, comprising:
receiving first, second, and third reference voltages at each of a plurality of unit digital-to-analog converter (DAC) elements included in a DAC, each unit DAC element having corresponding first and second outputs, the first outputs of the unit DAC elements coupled together to form a first DAC output, and the second outputs of the unit DAC elements coupled together to form a second DAC output;
receiving a plurality of first input signals at the plurality of unit DAC elements;
receiving a plurality of second input signals at the plurality of unit DAC elements;
receiving a plurality of third input signals at the plurality of unit DAC elements; and
generating a first output signal at the first DAC output and a second output signal at the second DAC output based on the first, second, and third input signals received by the plurality of unit DAC elements.

14. The method of claim 13, wherein for each unit DAC element:
receiving a first input signal at a first switch and a fourth switch, the first switch coupled between the first reference voltage and a first terminal of a first component, and the fourth switch coupled between the second reference voltage and a first terminal of a second component;
receiving the second input signal at a second switch and a third switch, the second switch coupled between the second reference voltage and the first terminal of the first component, and the third switch coupled between the first reference voltage and the first terminal of the second component;
receiving the third input signal at fifth and sixth switches, the fifth switch coupled between the third reference voltage and the first terminal of the first component, and the sixth switch coupled between the third reference voltage and the first terminal of the second component;
generating a first DAC element output signal from the second terminal of the first component; and
generating a second DAC element output signal from the second terminal of the second component.

15. The method of claim 13, wherein the first reference voltage is a positive voltage, the second reference voltage is a voltage less than the first reference voltage, and the third reference voltage is a voltage between the first reference voltage and the second reference voltage, inclusive.

16. The method of claim 13, further comprising for each unit DAC element:
coupling the first terminal of the first component to the first reference voltage and the first terminal of the second component to the second reference voltage in response to the first input signal being in a first state and the second and third input signals being in a second state;
coupling the first terminal of the first component to the second reference voltage and the first terminal of the second component to the first reference voltage in response to the second input signal being in the first state and the first and third reference signals being in the second state; and
coupling the first terminal of the first component and the first terminal of the second component to the third reference voltage in response to the third input signal being in the first state and the first and second input signals being in the second state.

17. The method of claim 13, further comprising:
shuffling the digital input signal, the shuffling comprising:
- receiving the digital input signal and generating a first symbol vector at a thermometer encoder,
- generating a second symbol vector that includes the first symbol vector, wherein the second symbol vector is generated to include swapped first and last elements of the first symbol vector when the digital input signal has a zero value,
- rearranging elements of the second symbol vector to generate a third symbol vector, and
- shuffling the third symbol vector to generate a fourth symbol vector; and inputting corresponding portions of the fourth symbol vector to the plurality of unit DAC elements as the plurality of first input signals.

18. The method of claim 13, further comprising:
generating a common mode control signal from a received common mode reference signal;
generating a delta-sigma modulated digital input signal from a received digital input signal;
generating a shuffled digital input signal from the delta-sigma modulated digital input signal and the common mode control signal;
receiving corresponding portions of the shuffled digital input signal at each of the plurality of unit DAC elements as the first input signals; and
generating an analog output signal from the first output signal received at an inverting input of an op-amp and from the second output signal received at a non-inverting input of the op-amp.

19. The method of claim 13, further comprising:
modulating the digital input signal using delta-sigma modulation.

20. The method of claim 18, wherein said generating a common mode control signal from a received common mode reference signal comprises:
modulating the common mode reference signal using delta-sigma modulation in a common mode delta-sigma modulator;
increasing a value that is fed-back to the common mode delta-sigma modulator in response to determining that the value is less than a set value; and
decreasing the value that is fed-back to the common mode delta-sigma modulator in response to determining that the value is greater than the set value.

* * * * *